United States Patent
Chung et al.

(10) Patent No.: US 10,600,913 B2
(45) Date of Patent: Mar. 24, 2020

(54) SEMICONDUCTOR DEVICE AND METHOD FOR FABRICATING THE SAME

(71) Applicant: Samsung Electronics Co., Ltd., Suwon-si (KR)

(72) Inventors: Won Keun Chung, Seoul (KR); Jong Ho Park, Suwon-si (KR); Seung Ha Oh, Seoul (KR); Sang Yong Kim, Suwon-si (KR); Hoon Joo Na, Hwaseong-si (KR); Sang Jin Hyun, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/100,804

(22) Filed: Aug. 10, 2018

(65) Prior Publication Data

US 2018/0350983 A1    Dec. 6, 2018

Related U.S. Application Data

(63) Continuation of application No. 15/620,631, filed on Jun. 12, 2017, now abandoned.

(30) Foreign Application Priority Data

Nov. 7, 2016   (KR) ......................... 10-2016-0147309

(51) Int. Cl.
*H01L 29/78* (2006.01)
*H01L 29/775* (2006.01)
(Continued)

(52) U.S. Cl.
CPC .......... *H01L 29/7831* (2013.01); *B82Y 10/00* (2013.01); *H01L 21/283* (2013.01);
(Continued)

(58) Field of Classification Search
CPC .............. H01L 29/78; H01L 29/4966; H01L 27/10823; H01L 29/7831; H01L 29/78696
See application file for complete search history.

(56) References Cited

U.S. PATENT DOCUMENTS 6,537,901 B2   3/2003   Cha et al.
7,122,474 B2   10/2006  Lee
(Continued)

FOREIGN PATENT DOCUMENTS

| JP | 2005-079512 A | 3/2005 |
| JP | 2013-147708 A | 8/2013 |
| WO | WO 2013-105389 A1 | 7/2013 |

*Primary Examiner* — Changhyun Yi
(74) *Attorney, Agent, or Firm* — Muir Patent Law, PLLC

(57) ABSTRACT

A semiconductor device and a method for fabricating the same are provided. The semiconductor device includes first and second gate stack structures formed in first and second regions, respectively, wherein the first gate stack structure is formed adjacent a first channel region and comprises a first gate insulating film having a first thickness formed on the first channel region, a first function film having a second thickness formed on the first gate insulating film and a first filling film having a third thickness formed on the first function film, wherein the second gate stack structure is formed adjacent a second channel region and comprises a second gate insulating film having the first thickness formed on the second channel region, a second function film having the second thickness formed on the second gate insulating film and a second filling film having the third thickness formed on the second function film, wherein the first and second function films, respectively, comprise TiN and Si concentrations that are different from each other.

20 Claims, 20 Drawing Sheets

(51) Int. Cl.
| | |
|---|---|
| *H01L 29/06* | (2006.01) |
| *H01L 29/66* | (2006.01) |
| *H01L 29/423* | (2006.01) |
| *B82Y 10/00* | (2011.01) |
| *H01L 29/786* | (2006.01) |
| *H01L 29/49* | (2006.01) |
| *H01L 29/51* | (2006.01) |
| *H01L 21/283* | (2006.01) |
| *H01L 21/324* | (2006.01) |

(52) U.S. Cl.
CPC ........ *H01L 21/324* (2013.01); *H01L 29/0653* (2013.01); *H01L 29/0673* (2013.01); *H01L 29/0676* (2013.01); *H01L 29/42356* (2013.01); *H01L 29/42364* (2013.01); *H01L 29/42392* (2013.01); *H01L 29/4908* (2013.01); *H01L 29/511* (2013.01); *H01L 29/513* (2013.01); *H01L 29/66439* (2013.01); *H01L 29/66484* (2013.01); *H01L 29/66666* (2013.01); *H01L 29/775* (2013.01); *H01L 29/7827* (2013.01); *H01L 29/78696* (2013.01)

(56) References Cited

U.S. PATENT DOCUMENTS

| | | | |
|---|---|---|---|
| 7,253,485 | B2 | 8/2007 | Shibahara |
| 7,397,095 | B2 | 7/2008 | Kim |
| 7,833,906 | B2 | 11/2010 | Knapp et al. |
| 7,919,820 | B2 | 4/2011 | Chung et al. |
| 8,643,121 | B2 | 2/2014 | Mueller et al. |
| 8,765,603 | B2 | 7/2014 | Hou et al. |
| 9,105,624 | B2 | 8/2015 | Yu et al. |
| 9,159,608 | B2 | 10/2015 | Park et al. |
| 9,196,546 | B2 | 11/2015 | Tzou et al. |
| 9,384,984 | B2 | 7/2016 | Lin et al. |
| 2007/0281415 | A1 | 12/2007 | Shibahara |
| 2015/0061041 | A1 | 3/2015 | Lin et al. |
| 2015/0076623 | A1 | 3/2015 | Tzou et al. |
| 2015/0171179 | A1 | 6/2015 | Horii et al. |
| 2016/0190019 | A1 | 6/2016 | Yang et al. |
| 2017/0125422 | A1* | 5/2017 | Kang ................ H01L 29/66795 |
| 2017/0207218 | A1 | 7/2017 | Chang et al. |
| 2019/0214460 | A1* | 7/2019 | Mistkawi .......... H01L 29/78696 |

* cited by examiner

SEMICONDUCTOR DEVICE AND METHOD FOR FABRICATING THE SAME

CROSS-REFERENCE TO RELATED APPLICATION

This application is a continuation of U.S. application Ser. No. 15/620,631 filed Jun. 12, 2017, which claims priority under 35 U.S.C. 119 to Korean Patent Application No. 10-2016-0147309 filed on Nov. 7, 2016 in the Korean Intellectual Property Office, the contents of each of these applications in their entirety being herein incorporated by reference.

BACKGROUND

1. Technical Field

The present disclosure relates to a semiconductor device and a method for fabricating the same.

2. Description of the Related Art

As one of the scaling technologies to increase the density of semiconductor devices, the multi-gate transistor has been suggested in which silicon bodies in a fin or nanowire shape are formed on a substrate, with gates then being formed on surfaces of the silicon bodies.

Such multi-gate transistor allows easy scaling, as it uses a three-dimensional channel. Further, current control capability can be enhanced without requiring increased gate length of the multi-gate transistor. Furthermore, it is possible to effectively suppress short channel effect (SCE) which is the phenomenon that the electric potential of the channel region is influenced by the drain voltage.

SUMMARY

It is one technical object of the present disclosure to provide a semiconductor device with improved operating characteristics.

It is another technical object of the present disclosure to provide a method for fabricating a semiconductor device with improved operating characteristics.

The objects according to the present disclosure are not limited to those set forth above and objects other than those set forth above will be clearly understood to a person skilled in the art from the following description.

According to an exemplary embodiment, there is provided a semiconductor device comprising first and second gate stack structures formed in first and second regions, respectively, wherein the first gate stack structure comprises a first channel region, a first gate insulating film having a first thickness formed on the first channel region, a first function film having a second thickness formed on the first gate insulating film and a first filling film having a third thickness formed on the first function film, wherein the second gate stack structure comprises a second channel region, a second gate insulating film having the first thickness formed on the second channel region, a second function film having the second thickness formed on the second gate insulating film and a second filling film having the third thickness formed on the second function film, wherein the first and second function films comprise TiN, and Si concentrations of the first and second function films are different from each other.

According to another exemplary embodiment, there is provided a semiconductor device, comprising a substrate comprising first and second regions, first and second channel regions formed in the first and second regions, respectively, first and second gate insulating films formed on the first and the second channel regions, respectively, first and second function films formed on the first and second gate insulating films, respectively and comprising TiN, wherein a Si concentration of the first function film and a Si concentration of the second function film are different from each other and first and second filling films formed on the first and the second function films, respectively, wherein the first and second function films are TiSiN single film, or multiple films including a TiN film and a Si film alternately stacked.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION

Figure 1:
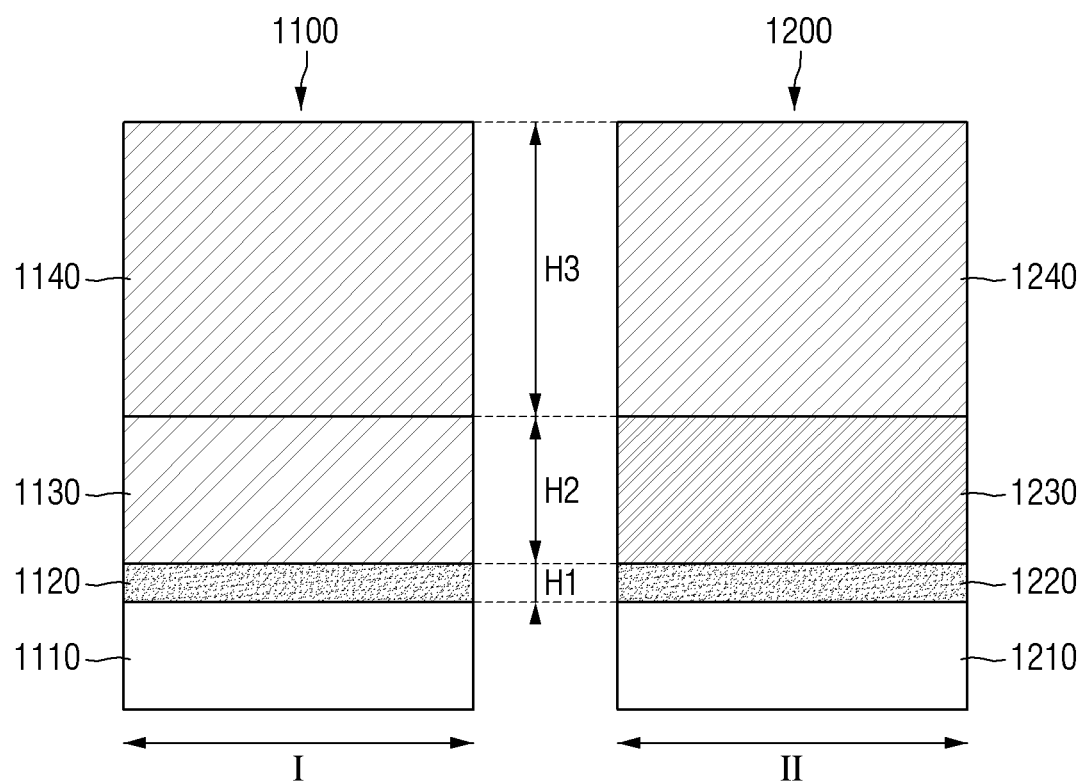
FIG. 1 is a concept view of a stack structure provided to explain a semiconductor device according to some exemplary embodiments.

The present disclosure now will be described more fully hereinafter with reference to the accompanying drawings, in which various exemplary embodiments are shown. The invention may, however, be embodied in many different forms and should not be construed as limited to the exemplary embodiments set forth herein. These example exemplary embodiments are just that—examples—and many embodiments and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The terminology used herein is for the purpose of describing particular exemplary implementations only and is not intended to be limiting of the invention. As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/".

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed exemplary implementations are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Hereinafter, a semiconductor device according to some exemplary embodiments will be described with reference to FIGS. 1 to 4.

FIG. 1 is a concept view of a stack structure provided to explain a semiconductor device according to some exemplary embodiments.

The semiconductor device according to some exemplary embodiments includes a first region I and a second region II. The first region I and the second region II may be the regions adjacent to each other, or the regions spaced apart from each other in the semiconductor device. The first region I and the second region II may be formed in the same direction, or different directions.

A first gate stack structure 1100 may be formed in the first region I. The first gate stack structure 1100 may be a stack structure serving as a gate electrode for the transistor. Subsequent other embodiments will be described in detail below with reference to an actual shape of the first gate stack structure 1100, after the order of stacking and characteristics of the structure are described.

The first gate stack structure 1100 may include a first channel region 1110, a first gate insulating film 1120, a first function film 1130, and a first filling film 1140.

The first channel region 1110 may be utilized as a channel region for the transistor. For example, the first channel region 1110 may include at least one of silicon, silicon germanium, indium antimonide, lead telluride compound, indium arsenide, indium phosphide, gallium arsenide, or gallium antimonide. However, it is assumed herein only for convenience of explanation that the first channel region 1110 includes silicon.

The first gate insulating film 1120 may be formed on the first channel region 1110. The first gate insulating film 1120 may directly contact the first channel region 1110. The first gate insulating film 1120 may prevent the first channel region 1110 from directly contacting the first function film 1130. Thus, the first gate insulating film 1120 may serve to insulate the gate of the transistor from the channel region between the source region and the drain region.

It is of course possible the first gate insulating film 1120 may include an insulator. For example, the first gate insulating film 1120 may include silicon oxide, silicon nitride, or silicon oxynitride, or a high-k material.

In an example, the high-k material may be material that has a higher dielectric constant (k) than the silicon oxide. For example, the high-k material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

The first gate insulating film 1120 may be formed with a first thickness H1. The first thickness H1 may be a thickness of the second gate insulating film 1220 that will be described below.

The first function film 1130 may be formed on the first gate insulating film 1120. The first function film 1130 may be in contact with the first gate insulating film 1120. The first function film 1130 may be spaced apart from the first channel region 1110 by the first gate insulating film 1120.

The first function film 1130 may be formed with a second thickness H2. The second thickness H2 may be a thickness of the second function film 1230 that will be described below.

The first function film 1130 may include TiSiN. At this time, the Si concentration of the first function film 1130 may be deemed a first concentration. The first concentration may be different from Si concentration of the second function film 1230 that will be described below. The first concentration of Si may be 0% so that the first function film 1130 may include TiN.

In some exemplary embodiments, Ti and Si of the TiSiN may be replaced by at least two of Ta, La, Hf, Mo and Yb. Likewise, in some exemplary embodiments, N of the TiSiN may be replaced by at least one of O, C, S and Se. In some exemplary embodiments, TiSiN may all be replaced by the corresponding materials. However, for convenience of explanation, the following embodiment is described based on TiSiN.

The first function film 1130 may have a function of adjusting work function. Thus, the first function film 1130 may adjust the threshold voltage of the gate. At the same time, the first function film 1130 may also function as a barrier film that prevents oxygen from being excessively introduced into the first gate insulating film 1120 during a process such as heat treatment. Thus, the first function film 1130 may perform both the functions of oxygen block and work function adjustment.

The first filling film 1140 may be formed on the first function film 1130. The first filling film 1140 may be contacted with the first function film 1130. The first filling film 1140 may be formed on the first function film 1130 to thus complete the first gate stack structure 1100.

The first filling film 1140 may be formed with a third thickness H3. The third thickness H3 may be a thickness of the second filling film 1240 that will be described below. The first filling film 1140 may include a metal material having a conductivity. For example, the first filling film 1140 may be formed of Al, W, and so on, or multi-films formed of a combination thereof. However, exemplary embodiments are not limited thereto.

The second gate stack structure 1200 may include a second channel region 1210, a second gate insulating film 1220, a second function film 1230, and a second filling film 1240.

The second channel region 1210 may be utilized as a channel region for the transistor. For example, the second channel region 1210 may include at least one of silicon, silicon germanium, indium antimonide, lead telluride compound, indium arsenide, indium phosphide, gallium arsenide, or gallium antimonide. However, it is assumed herein only for convenience of explanation that the second channel region 1210 includes silicon. That is, the first channel region 1110 and the second channel region 1210 may be the same structure. Note that the concept "same"

may include fine differences that may occur according to characteristics of each region.

The second gate insulating film 1220 may be formed on the second channel region 1210. The second gate insulating film 1220 may directly contact the second channel region 1210. The second gate insulating film 1220 may prevent the second channel region 1210 from directly contacting the second function film 1230. Thus, the second gate insulating film 1220 may insulate the gate of the transistor from the channel region between the source region and the drain region.

The second gate insulating film 1220 may include the same material as the first gate insulating film 1120. That is, the second gate insulating film 1220 may include silicon oxide, silicon nitride, or silicon oxynitride, or a high-k material, for example.

The second gate insulating film 1220 may be formed with a first thickness H1. The first thickness H1 may be a thickness of the first gate insulating film 1120.

The second function film 1230 may be formed on the second gate insulating film 1220. The second function film 1230 may be in contact with the second gate insulating film 1220. The second function film 1230 may be spaced apart from the second channel region 1210 by the second gate insulating film 1220.

The second function film 1230 may be formed with a second thickness H2. The second thickness H2 may be a thickness of the first function film 1130.

The second function film 1230 may include TiSiN. At this time, the Si concentration of the second function film 1230 may be a second concentration which is different from the first concentration of Si in first function film 1100. Thus, the Si concentration of the first function film 1130 and Si concentration of the second function film 1230 may be different from each other. Specifically, the second concentration may be higher than the first concentration.

In some exemplary embodiments, Ti and Si of the TiSiN may be replaced by at least two of Ta, La, Hf, Mo and Yb. Likewise, in some exemplary embodiments, N of the TiSiN may be replaced by at least one of O, C, S and Se. In some exemplary embodiments, TiSiN may all be replaced by the corresponding materials. However, for convenience of explanation, the following description is based on TiSiN.

The second function film 1230 may adjust work function. Thus, the second function film 1230 may adjust the threshold voltage of the gate. At the same time, the second function film 1230 may function as a barrier that prevents oxygen from being excessively introduced into the second gate insulating film 1220 during a process such as heat treatment.

The second filling film 1240 may be formed on the second function film 1230. The second filling film 1240 may be contacted with the second function film 1230. The second gate stack structure 1200 may be completed when the second filling film 1240 is formed on the second function film 1230.

The second filling film 1240 may be formed with a third thickness H3. The third thickness H3 may be a thickness of the first filling film 1140. The second filling film 1240 may have the same thickness as the first filling film 1140. However, exemplary embodiments are not limited to the example given above.

The second filling film 1240 may include a same material as the first filling film 1140. The second filling film 1240 may include a metal material having a conductivity. For example, the second filling film 1240 may be formed of Al, W, and so on, or multiple films formed of a combination thereof. However, exemplary embodiments are not limited thereto.

The first gate stack structure 1100 and the second gate stack structure 1200 may be formed with the same height as each other. Further, in each set of corresponding films, the first gate insulating film 1120 and the second gate insulating film 1220, the first function film 1130 and the second function film 1230, and the first filling film 1140 and the second filling film 1240, the thickness of each member of the set may be the same. However, exemplary embodiments are not limited to the example given above. The description of each thickness in each detailed embodiment continues below.

The first function film 1130 and the second function film 1230 may have the same thickness as each other. Meanwhile, the first function film 1130 and the second function film 1230 may have the different Si concentrations from each other. Accordingly, threshold voltages of the first gate stack structure 1100 and the second gate stack structure 1200 may vary. That is, two films having the same thickness may have different concentrations of Si from each other without adjusting the thickness of the work function adjusting film, so that different threshold voltages can be implemented.

Specifically, Si concentration of the second function film 1230 may be higher than Si concentration of the first function film 1130. Accordingly, the threshold voltage of the second gate stack structure 1200 may be higher than that of the first gate stack structure 1100.

In some exemplary embodiments, the first function film 1130 and the second function film 1230 are formed to have the same thickness, so that the process involving patterning, deposition, and etching repeated for several times can be greatly reduced to one deposition process. Such simple process can also implement different work functions or threshold voltages.

Further, because the functions of the work function adjustment film and the barrier film may be performed simultaneously with the first function film 1130 and the second function film 1230, the process of forming a separate barrier film can also be reduced.

As a result, a semiconductor device having better operating characteristics at a lower cost can be provided. In addition, as the first function film 1130 and the second function film 1230 having the same thickness are formed, the process of forming the first filling film 1140 and second filling film 1240 is further facilitated, and more precise multi-threshold voltage devices can be implemented.

In this case, the first function film 1130 and the second function film 1230 may be an amorphous film. As a result, the property to prevent leakage current occurred in the crystallized film can be further strengthened.

Hereinbelow, a semiconductor device according to some exemplary embodiments will be described with reference to FIGS. 2 and 3. In the following description, description overlapped with the exemplary embodiments already provided above will not be described or described as brief as possible for the sake of brevity.

Figure 2:
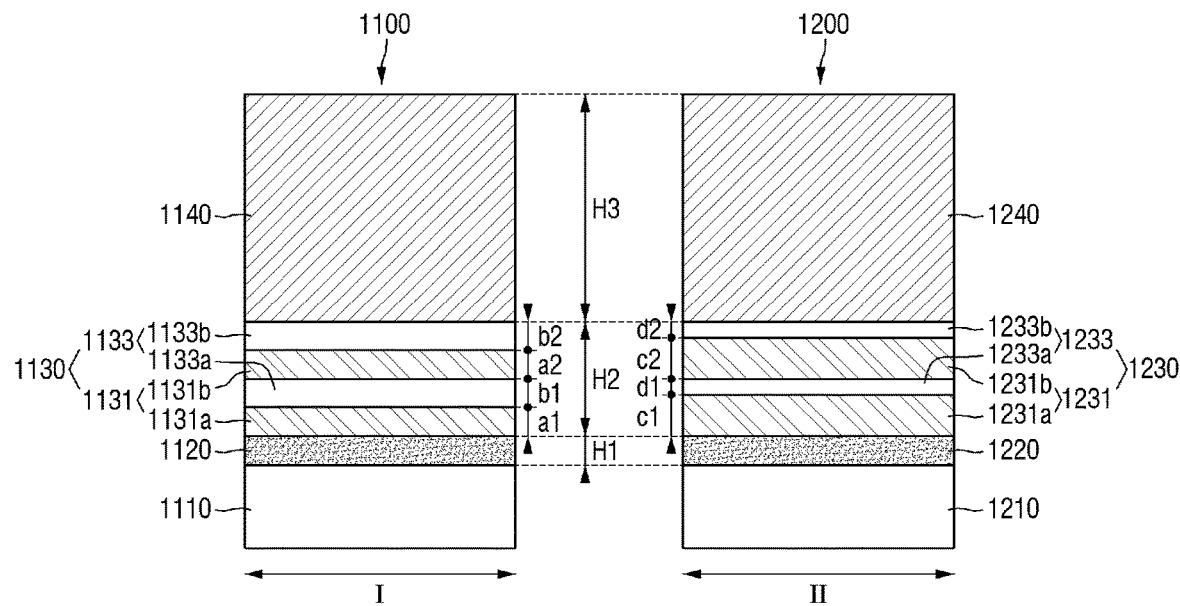
FIG. 2 is a concept view of a stack structure provided to explain a semiconductor device according to some exemplary embodiments.
Figure 3:
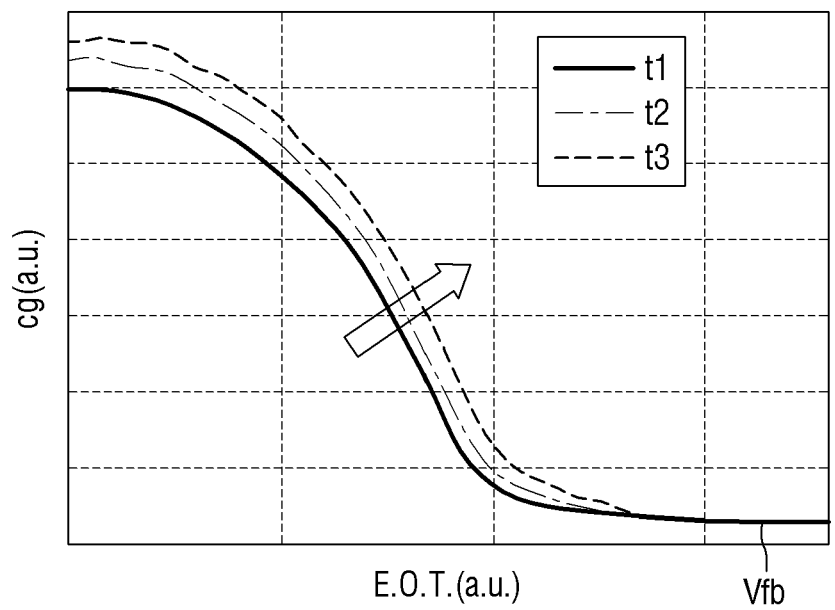
FIG. 3 is a graph provided to explain threshold voltage change according to a thickness ratio of the stack structure of FIG. 2.

FIG. 2 is a conceptual diagram of a stack structure provided to explain a semiconductor device according to some embodiments, and FIG. 3 is a graph provided to explain a threshold voltage change according to a thickness ratio of the stack structure of FIG. 2. The abscissa axis in FIG. 3 represents the equivalent oxide film thickness (EOT), and the ordinate axis represents the capacitance in the gate direction.

As shown in FIG. 2, the first function film 1130 and the second function film 1230 of the semiconductor device according to some exemplary embodiments may be a multi-film structure rather than a single film.

The first function film 1130 of the first gate stack structure 1100 in the first region I may include first interfacial function film 1130 including first interfacial function films 1131*a* and 1131*b* and first barrier function film 1133 including first barrier function films 1133*a* and 1133*b*. The first interfacial function films 1131*a* and 1131*b* and the first barrier function films 1133*a* and 1133*b* may be alternately stacked with each other. At this time, each of the first interfacial function films 1131*a* and 1131*b* and the first barrier function films 1133*a* and 1133*b* may be plural. However, the present disclosure is not limited thereto, and the first interfacial function films 1131*a* and 1131*b* and the first barrier function films 1133*a* and 1133*b* may each be a single film.

The first interfacial function films 1131*a* and 1131*b* are in direct contact with the first gate insulating film 1120, and the first barrier function films 1133*a* and 1133*b* are not in contact with the first gate insulating film 1120. The lowermost portion of the first function film 1130 may be the first interfacial function films 1131*a* and 1131*b*.

The first interfacial function films 1131*a* and 1131*b* may enhance an interfacial characteristic with the first gate insulating film 1120. The first interfacial function films 1131*a* and 1131*b* may include TiN, for example. However, exemplary embodiments are not limited to the example given above. The TiN may be formed by atomic layer deposition (ALD). The first interfacial function films 1131*a* and 1131*b* may be amorphous.

The first barrier function films 1133*a* and 1133*b* may include Si. The first barrier function films 1133*a* and 1133*b* may perform a barrier function to prevent excessive diffusion of oxygen into the first gate insulating film 1120 thereunder in a subsequent process such as heat treatment.

The first barrier function films 1133*a* and 1133*b* may form Si in the soak method. The soak method is one of the methods of directly forming a single film, unlike the method of forming two or more films by a heat treatment.

The first interfacial function films 1131*a* and 1131*b* may each have, respectively, thicknesses a1 and a2. In this case, the thicknesses a1 and a2 may be the same as each other, or may be different from each other. The first barrier function films 1133*a* and 1133*b* may each have, respectively, thicknesses b1 and b2. In this case, the thicknesses b1 and b2 may be the same as each other, or may be different from each other.

At this time, ratio of (a1+a2):(b1+b2) may be considered as a first ratio. The first ratio may be different from the second ratio of the second function film 1230 that will be described below.

The second function film 1230 of the second gate stack structure 1200 in the second region II may include second interfacial function film 1231 including second interfacial function films 1231*a* and 1231*b* and second barrier function film 1233 including second barrier function films 1233*a* and 1233*b*. The second interfacial function films 1231*a* and 1231*b* and the second barrier function films 1233*a* and 1233*b* may be alternately stacked with each other. At this time, each of the second interfacial function films 1231*a* and 1231*b* and the second barrier function films 1233*a* and 1233*b* may be plural. However, the present disclosure is not limited thereto, and the second interfacial function films 1231*a* and 1231*b* and the second barrier function films 1233*a* and 1233*b* may each be a single film.

The second interfacial function films 1231*a* and 1231*b* are in direct contact with the second gate insulating film 1220, and the second barrier function films 1233*a* and 1233*b* are not in contact with the second gate insulating film 1220. The lowermost portion of the second function film 1230 may be the second interfacial function films 1231*a* and 1231*b*.

The second interfacial function films 1231*a* and 1231*b* may enhance interfacial properties with the second gate insulating film 1220. The second interfacial function films 1231*a* and 1231*b* may include TiN, for example. However, exemplary embodiments are not limited to the example given above. TiN may be formed by ALD. The second interfacial function films 1231*a* and 1231*b* may be amorphous.

The second barrier function films 1233*a* and 1233*b* may include Si. The second barrier function films 1233*a* and 1233*b* may perform a barrier function to prevent excessive diffusion of oxygen into the second gate insulating film 1220 thereunder in a subsequent process such as heat treatment. The second barrier function films 1233*a* and 1233*b* may form Si in the soak method.

The second interfacial function films 1231*a* and 1231*b* may each have, respectively, thicknesses c1 and c2. In this case, the thicknesses c1 and c2 may be the same as each other, or may be different from each other. The second barrier function films 1233*a* and 1233*b* may each have, respectively, thicknesses d1 and d2. In this case, the thicknesses d1 and d2 may be the same as each other, or may be different from each other.

At this time, ratio of (c1+c2):(d1+d2) may be considered to be a second ratio. The second ratio may be different from the first ratio of the first function film 1130. Specifically, the first ratio may be lower than the second ratio. For example, the thickness of the first barrier function films 1133*a* and 1133*b* with respect to that of the first interfacial function films 1131*a* and 1131*b* may be less than the thickness of the second barrier function films 1233*a* and 1233*b* with respect to that of the second interfacial function films 1231*a* and 1231*b*. The Si content in each function film may correspond to the thickness of the barrier function film. Thus, when the barrier function film is thick, the Si content may be high, and conversely, when the barrier function film is thin, the Si content may be low.

Although the thicknesses of the specific layers may be different from each other, a second thickness H2 of the first function film 1130 and the second function film 1230 may be the same as each other. Accordingly, it is possible to compare the Si contents in the same state.

As shown in FIG. 3, it can be seen that flatband voltage (vfb) changes as the thickness of the barrier function film gradually increases from t1 to t2 and then to t3. Therefore, it can be confirmed that the threshold voltage changes in accordance with the thickness of the barrier function film. Thus, the second gate stack structure 1200, including the second function film 1230 in the second region II which has a lower Si content, may have a lower threshold voltage than the first gate stack structure 1100.

Hereinbelow, a semiconductor device according to some exemplary embodiments will be described with reference to FIG. 4. In the following description, the previously provided description of exemplary embodiments will not be repeated or will be described as briefly as possible for the sake of brevity.

Figure 4:
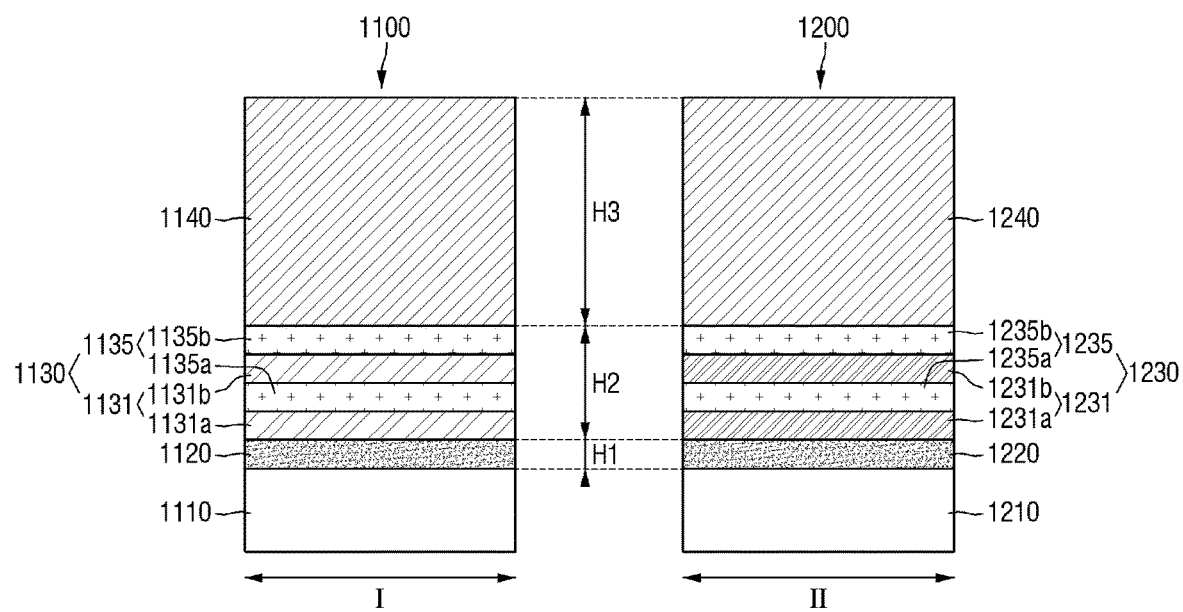
FIG. 4 is a concept view of a stack structure provided to explain a semiconductor device according to some exemplary embodiments.

FIG. 4 is a concept view of a stack structure provided to explain a semiconductor device according to some exemplary embodiments.

As shown in FIG. 4, a material of the first interfacial function films 1131*a* and 1131*b* and the second interfacial function films 1231*a* and 1231*b* of the semiconductor device according to some embodiments, and a material of the first barrier function films 1135*a* and 1135*b* and the second barrier function films 1235*a* and 1235*b* may each be the same.

The first interfacial function films 1131*a* and 1131*b* and the second interfacial function films 1231*a* and 1231*b* may each enhance interfacial properties with the first gate insulating film 1120 and the second gate insulating film 1220. The first interfacial function films 1131*a* and 1131*b* and the second interfacial function films 1231*a* and 1231*b* may include TiSiN, for example. At this time, the Si concentration of the first interfacial function films 1131*a* and 1131*b* and the Si concentration of the second interfacial function films 1231*a* and 1231*b* may be different from each other. Specifically, the Si concentration of the second interfacial function films 1231*a* and 1231*b* may be higher than that of the first interfacial function films 1131*a* and 1131*b*. The first interfacial function films 1131*a* and 1131*b* and the second interfacial function films 1231*a* and 1231*b* may all be amorphous.

The first interfacial function film 1131 which includes first interfacial films 1131*a* and 1131*b* and the second interfacial function film 1231 which includes second interfacial function films 1231*a* and 1231*b*, may include TiSiN, and the first barrier function film 1135 which include first barrier function films 1135*a* and 1135*b* and the second barrier function film 1235 which includes second barrier function films 1235*a* and 1235*b*, may likewise include TiSiN. However, the first barrier function films 1135*a* and 1135*b* and the second barrier function films 1235*a* and 1235*b* may have a different phase from the first interfacial function films 1131*a* and 1131*b* and the second interfacial function films 1231*a* and 1231*b*. For example, the first barrier function films 1135*a* and 1135*b* and the second barrier function films 1235*a* and 1235*b* may all be crystalline. The first function film 1130 and the second function film 1230 may be a structure in which the amorphous film and the crystalline film are alternately stacked.

At this time, the thickness of the first barrier function films 1135*a* and 1135*b* with respect to that of the first interfacial function films 1131*a* and 1131*b* may be equal to or different from the thickness of the second barrier function films 1235*a* and 1235*b* with respect to that of the second interfacial function films 1231*a* and 1231*b*.

Hereinbelow, a semiconductor device according to some exemplary embodiments will be described with reference to FIGS. 1, and 5 to 8. In the following description, the previously provided description of exemplary embodiments will not be described again or will be described as briefly as necessary.

Figure 5:
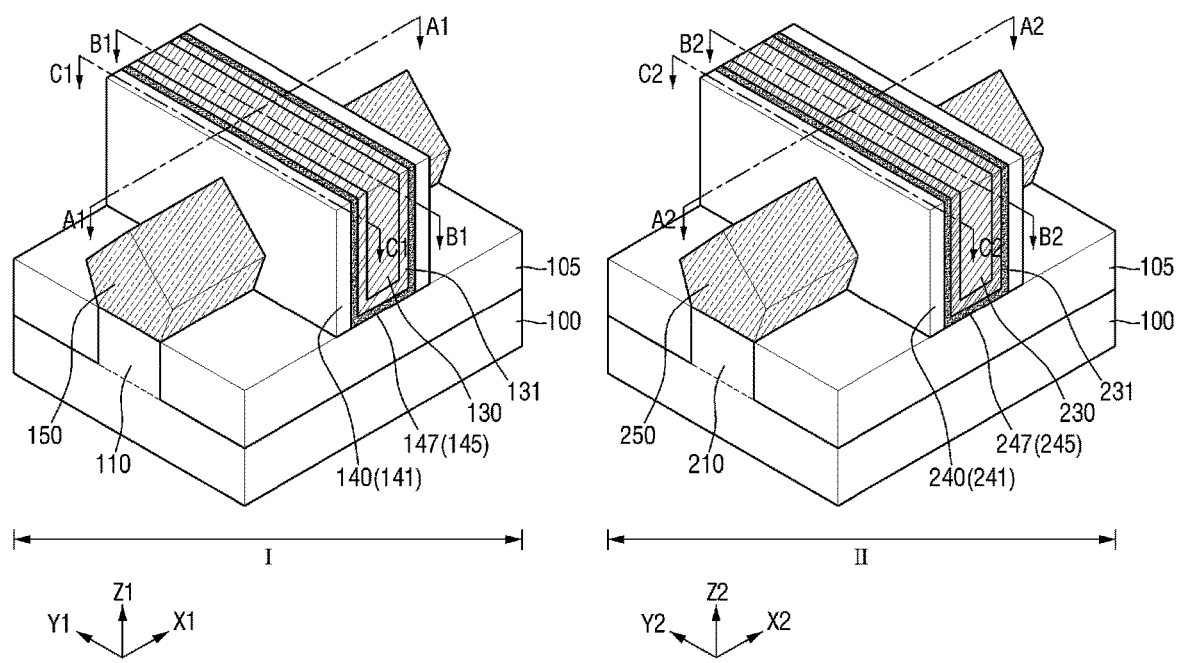
FIG. 5 is a perspective view illustrating a semiconductor device according to some exemplary embodiments.
Figure 6:
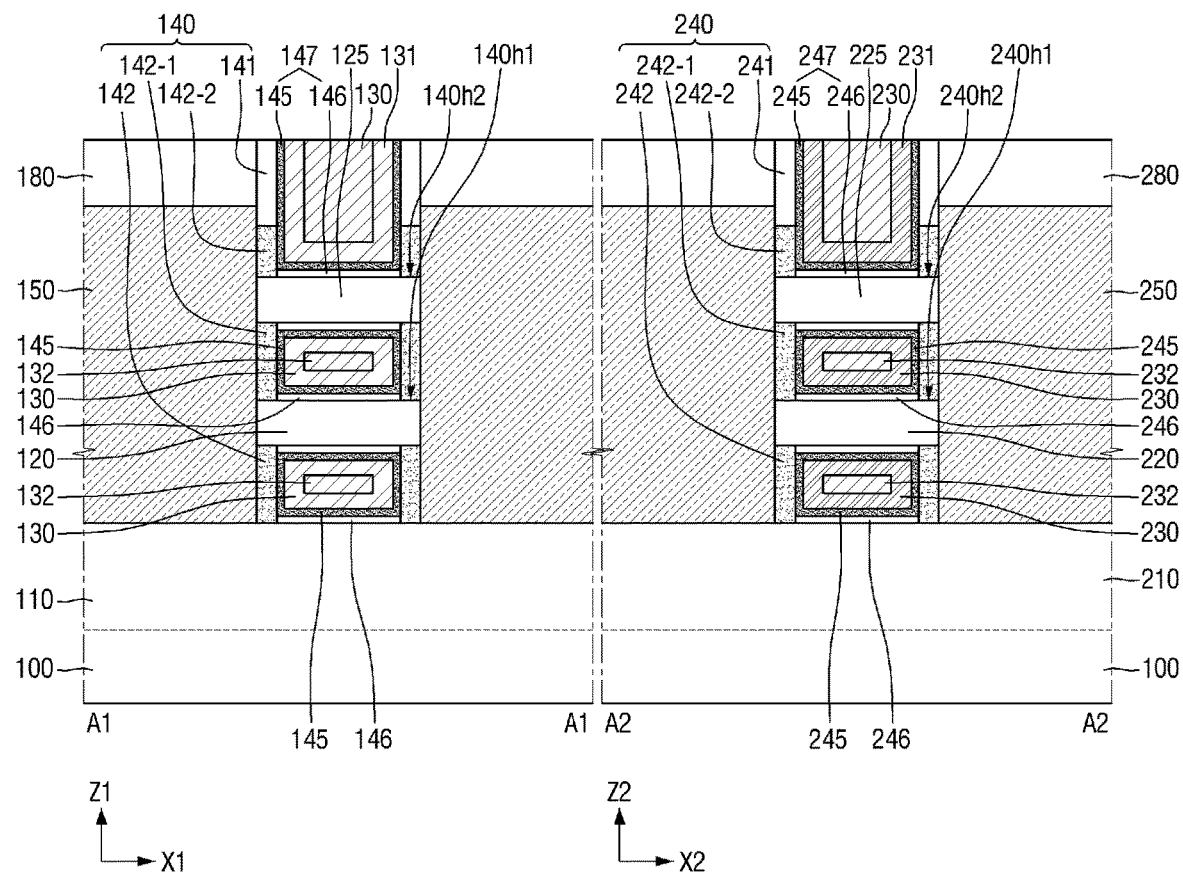
FIG. 6 is a cross sectional view taken on lines A1-A1 and A2-A2 of FIG. 5.
Figure 7:
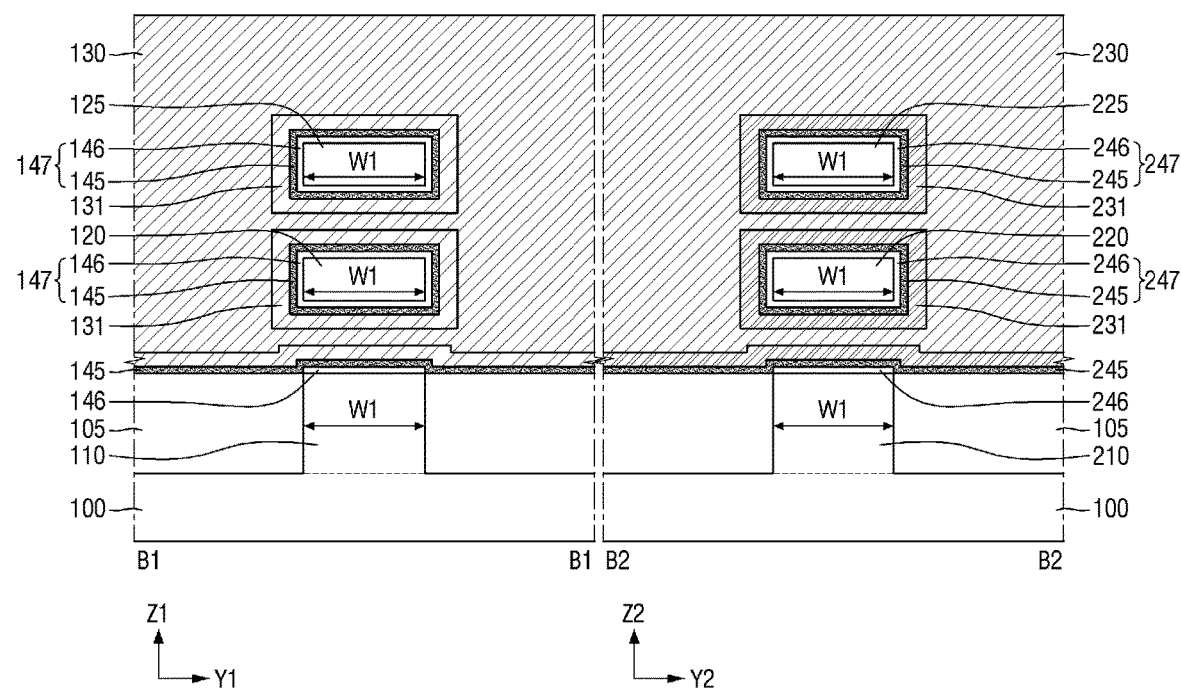
FIG. 7 is a cross sectional view taken on lines B1-B1 and B2-B2 of FIG. 5.
Figure 8:
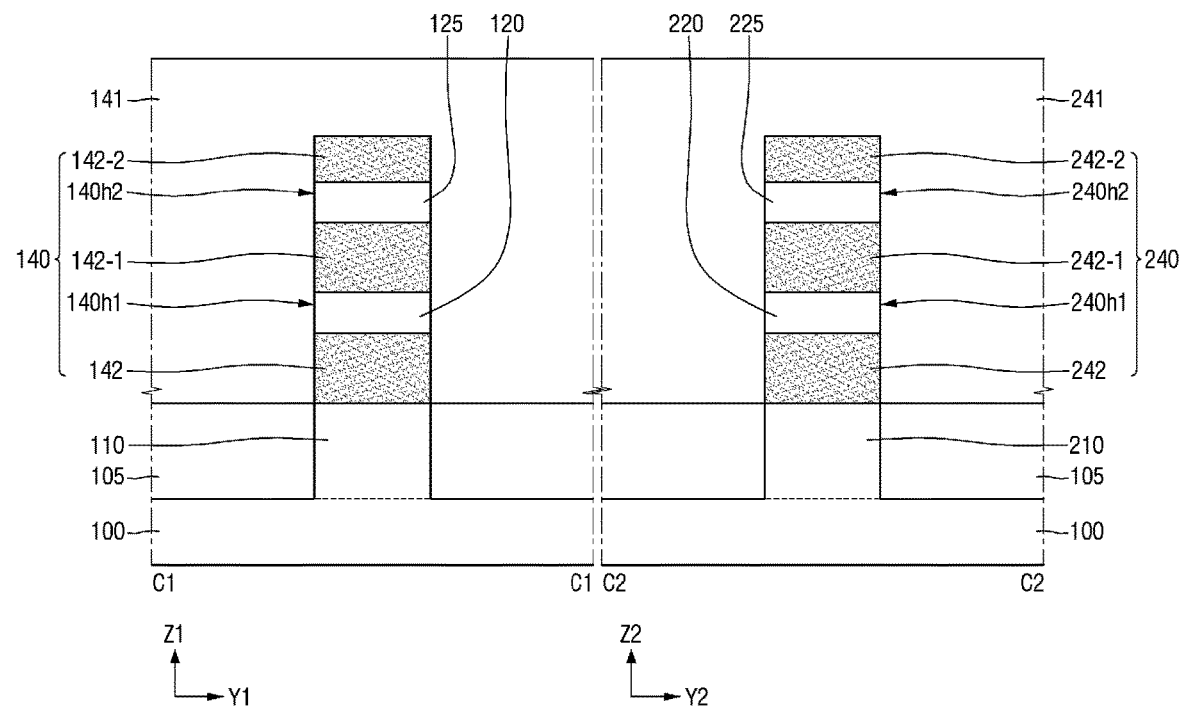
FIG. 8 is a cross sectional view taken on lines C1-C1 and C2-C2 of FIG. 5.

FIG. 5 is a perspective view provided to explain a semiconductor device according to some exemplary embodiments, and FIG. 6 is a cross sectional view taken on lines A1-A1 and A2-A2 of FIG. 5. FIG. 7 is a cross sectional view taken on lines B1-B1 and B2-B2 of FIG. 5, and FIG. 8 is a cross sectional view taken on lines C1-C1 and C2-C2 of FIG. 5.

As shown in FIGS. 5 to 8, a semiconductor device according to some exemplary embodiments may include a substrate 100 including a first region I and a second region II.

The substrate 100 may be, for example, a bulk silicon or a silicon-on-insulator (SOI). Alternatively, the substrate 100 may include a material different from silicon, for example, silicon germanium, indium antimonide, lead telluride compound, indium arsenide, indium phosphide, gallium arsenide, or gallium antimonide. Alternatively, the substrate 100 may be a base substrate having an epitaxial layer formed thereon.

The first region I and the second region II on the substrate 100 may be the regions adjacent to each other, or the regions spaced apart from each other. Thus, as long as the condition that the regions be formed on the same substrate is satisfied, the positions of the first region I and the second region II are not limited.

The first region I on the substrate 100 may be represented by a first direction X1, a second direction Y1, and a third direction Z1, which are perpendicular to each other. Meanwhile, the second region II may be represented by a fourth direction X2, a fifth direction Y2, and a sixth direction Z2, which are perpendicular to each other. The first to third directions and the fourth to sixth directions of the first region I and the second region II may be in the same directions or different directions.

The first region I may include a first fin-type pattern 110, a first nanowire 120, a third nanowire 125, a first gate insulating film 147, a first function film 131, a first filling film 130, a first gate spacer 140, a first source/drain 150, and so on.

The first fin-type pattern 110 may protrude from the substrate 100. The first fin-type pattern 110 may elongate in the first direction X1. The first fin-type pattern 110 may include a long side extended in the first direction X1, and a short side extended in the second direction Y1.

The first fin-type pattern 110 may be formed by partially etching the substrate 100, and may include an epitaxial layer grown from the substrate 100. The first fin-type pattern 110 may include an element semiconductor material such as silicon or germanium, for example. Further, the first fin-type pattern 110 may include a compound semiconductor such as, for example, IV-IV group compound semiconductor or III-V group compound semiconductor.

For example, take with respect to the IV-IV group compound semiconductor the first fin-type pattern 110 may be a binary compound or a ternary compound including, for example, at least two or more of carbon (C), silicon (Si), germanium (Ge), and tin (Sn), or the above-mentioned binary or ternary compound doped with IV group element.

With respect to the III-V group compound semiconductor, the fin-type pattern 110 may be a binary compound, ternary compound or quaternary compound which is formed as a III group element which may be at least one of aluminum (Al), gallium (Ga), and indium (In), is combined with a V group element which may be one of phosphorus (P), arsenic (As) and antimony (Sb).

In the following description, it is assumed that the first fin-type pattern 110 of a semiconductor device according to exemplary embodiments includes silicon.

A field insulating film 105 may at least partially surround the sidewall of the first fin-type pattern 110. The first fin-type pattern 110 may be defined by the field insulating film 105. The field insulating film 105 may include, for example, one of oxide film, nitride film, oxynitride film, or a combination thereof.

As illustrated in FIG. 5, the sidewall of the first fin-type pattern 110 may be surrounded by the field insulating film 105, but note that this is only for illustrative purpose, and other embodiments are not limited thereto.

The first nanowire 120 and the third nanowire 125 may be formed on the substrate 100, while being spaced apart from the first fin-type pattern 110. The first nanowire 120 and third nanowire 125 may be extended in the first direction X1. Specifically, the first nanowire 120 and the third nanowire 125 may be formed on the first fin-type pattern 110, while being spaced apart from the first fin-type pattern 110. Further, the first nanowire 120 and third nanowire 125 may be spaced apart from each other.

The third nanowire 125 may be spaced apart from the substrate 100 further than the first nanowire 120. That is, the height from the upper surface of the first fin-type pattern 110 to the third nanowire 125 may be greater than the height from the upper surface of the first fin-type pattern 110 to the first nanowire 120.

The first nanowire 120 and the third nanowire 125 may be overlapped with the fin-type pattern 110 in the third direction Z1. The first nanowire 120 and the third nanowire 125 may not be formed on the field insulating film 105, and may be formed on the first fin-type pattern 110.

The first nanowire 120 and the third nanowire 125 may be used as a channel region for the transistor. The materials for the first nanowire 120 and the third nanowire 125 may vary depending on whether the semiconductor device is a PMOS or an NMOS, but other exemplary embodiments are not limited thereto.

In the semiconductor device according to exemplary embodiments, it is assumed that the first nanowire 120 and the third nanowire 125 each include silicon.

The first function film 131 and the first filling film 130 may be formed on the field insulating film 105 and the first fin-type pattern 110. The first filling film 130 may extend in the second direction Y1. The first function film 131 and the first filling film 130 may be so formed as to surround the periphery of the first nanowire 120 and the third nanowire 125 that are spaced apart from an upper surface of the first fin-type pattern 110. The first function film 131 and the first filling film 130 may also be formed in a space defined between the first nanowire 120 and the third nanowire 125 and the first fin-type pattern 110.

Specifically, the first function film 131 may be formed first to surround the first nanowire 120 and the third nanowire 125, and the first filling film 130 may be formed thereon to surround the first function film 131.

The first function film 131 may include TiSiN.

The first filling film 130 may include a conductive material. For example, the first filling film 130 may include at least one of TiN, WN, TaN, Ru, TiC, TaC, Ti, Ag, Al, TiAl, TiAlN, TiAlC, TaCN, TaSiN, Mn, Zr, W, and Al. Alternatively, the first filling film 130 may each be formed of non-metal element such as Si, SiGe, and so on. For example, the first filling film 130 described above may be formed by replacement process, but not limited thereto.

The first gate spacer 140 may be formed on both sidewalls of the first gate electrode 130 that are extended in the second direction Y1. The first gate spacer 140 may be formed on either side of the first nanowire 120, while facing each other. The first gate spacer 140 may each include a through hole 140$h$1 and 140$h$2 (FIGS. 6 and 8).

The first nanowire 120 may be passed through the first gate spacer 140 via the first through hole 140$h$1. The first gate spacer 140 may be in direct contact with a periphery portion of the side surface of the first nanowire 120. The inner wall of the first through hole 140$h$1 may be in contact with a portion of the outer surface periphery of the first nanowire 120.

The first gate spacer 140 may include the first outer spacer 141 and the first inner spacer 142, the second inner spacer 142-1, and the fifth inner spacer 142-2. The first outer spacer 141 may directly contact with the first inner spacer 142, the second inner spacer 142-1, and the fifth inner spacer 142-2. The first inner spacer 142 may be disposed between the upper surface of the first fin-type pattern 110 and the first nanowire 120, and may be in surface contact with the upper surface of the first fin-type pattern 110. The second inner spacer 142-1 may be disposed between the upper surface of the first nanowire 120 and the third nanowire 125, and may be surrounded by the first outer spacer 141. The fifth inner spacer 142-2 may be disposed on the third nanowire 125, and may be surrounded by the first outer spacer 141.

On a plane including the second direction Y1 and the third direction Z1 (shown in FIG. 8), the first inner spacer 142 may be surrounded by the first nanowire 120, the first outer spacer 141, and the fin-type pattern 110. The second inner spacer 142-1 may be surrounded by the first nanowire 120, the third nanowire 125, and the first outer spacer 141. The fifth inner spacer 142-2 may be surrounded by the third nanowire 125 and the first outer spacer 141.

The gate spacer 140 may include a plurality of first through holes 140$h$1 and 140$h$2. The plurality of first through holes 140$h$1 and 140$h$2 of the first gate spacer 140 may be defined, respectively, by: the first outer spacer 141, the first inner spacer 142, and the second inner spacer 142-1 the first outer spacer 141, the second inner spacer 142-1 and the fifth inner spacer 142-2. Ends of the first nanowire 120 and the third nanowire 125 may be in contact with the first outer spacer 141, the first inner spacer 142, the second inner spacer 142-1, and the fifth inner spacer 142-2.

The first inner spacer 142, the second inner spacer 142-1, and the fifth inner spacer 142-2 may include the same material as one another. The first outer spacer 141, the first inner spacer 142, the second inner spacer 142-1, and the fifth inner spacer 142-2 may have different materials from one another. For example, the dielectric constant of the material contained in the first outer spacer 141 may differ from the dielectric constant of the material contained in the first inner spacer 142, the second inner spacer 142-1, and the fifth inner spacer 142-2.

In the semiconductor device according to some exemplary embodiments, the material included in the first outer spacer 141 may have a dielectric constant that is greater than the dielectric constant of the material included in the first inner spacer 142, the second inner spacer 142-1, and the fifth inner spacer 142-2. It is possible to reduce the fringing capacitance between the first gate electrode 130 and the first source/drain 150 by having differing dielectric constants for these materials as described above.

For example, the first outer spacer 141 may include at least one of silicon nitride (SiN), silicon oxynitride (SiON), silicon oxide (SiO2), silicon oxycarbonitride (SiOCN), or a combination thereof. The first inner spacer 142 and the second inner spacer 142-1 may include low-k dielectric material, for example. The low-k dielectric material may be the material that has a lower dielectric constant than the silicon oxide.

The first gate insulating layer 147 may be formed between the first nanowire 120 and the third nanowire 125 and the first function film 131 (shown in FIG. 7). Further, the first gate insulating film 147 may also be formed between the field insulating film 105 and the first function film 131, and between the first inner spacer 142, the second inner spacer 142-1, the fifth inner spacer 142-2, and the first function film 130.

For example, the first gate insulating layer 147 may include a first interfacial layer 146 and a first high-k insulating film 145, but not limited thereto. Thus, the first interfacial layer 146 of the first gate insulating film 147 may be omitted depending on a material of the first nanowire 120 and the third nanowire 125, and so on.

Because the first interfacial layer 146 may be formed on a periphery of the first nanowire 120 and the third nanowire 125, the first interfacial layer 146 may be formed between the first nanowire 120 and the third nanowire 125 and the first function film 131, and between the first fin-type pattern 110 and the first function film 131.

When the first nanowire 120 and the third nanowire 125 include silicon, the first interfacial layer 146 may include silicon oxide film. The first interfacial layer 146 may be formed on a periphery of the first nanowire 120 and the third nanowire 125, but may not be formed along the sidewalls of the first inner spacer 142, the second inner spacer 142-1, the fifth inner spacer 142-2, and the first outer spacer 141.

However, the first high-k insulating film 145 may be formed between the first nanowire 120 and the third nanowire 125 and the first function film 131, between the first inner spacer 142 and the first function film 131, between the second inner spacer 142-1 and the first function film 131, between the fifth inner spacer 142-2 and the first function film 131, between the field insulating film 105 and the first function film 131, and between the first outer spacer 141 and the first function film 131.

The first high-k insulating film 145 may include a high-k material having a higher dielectric constant than silicon oxide film. For example, the high-k material may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but is not limited thereto.

As described above, when the first interfacial layer 146 is omitted, the first high-k insulating film 145 may include not only the high-k material, but also at least one of silicon nitride (SiN), silicon oxynitride (SiON), silicon oxide (SiO2), silicon oxycarbonitride (SiOCN), or a combination thereof.

The first gate insulating film 147 may be formed along the periphery of the first nanowire 120 and the third nanowire 125. The first gate insulating film 147 may be formed along the upper surface of the field insulating film 105 and the upper surface of the first fin-type pattern 110. Additionally, the first gate insulating film 147 may be formed along the sidewalls of the first inner spacer 142, the second inner spacer 142-1, the fifth inner spacer 142-2, and the first outer spacer 141.

A first source/drain 150 may be formed on either side of the first filling film 130 and the first function film 131. The first source/drain 150 may be formed on the first fin-type pattern 110. The first source/drain 150 may include an epitaxial layer formed on an upper surface of the first fin-type pattern 110.

An outer circumference of the first source/drain 150 may take on a variety of shapes. For example, the outer circumference of the first source/drain 150 may be at least one of diamond, circle, rectangle, and octagon shapes. FIG. 5 illustrates a diamond shape (or pentagon or hexagon shape), for example.

The first source/drain 150 may be directly connected with the first nanowire 120 and the third nanowire 125 being used as a channel region. Thus, the first source/drain 150 may be directly connected with the first nanowire 120 and the third nanowire 125 that are passed through the plurality of first through holes 140h1 and 140h2 of the first gate spacer 140.

However, the first source/drain 150 may not be in direct contact with the first gate insulating film 147. The first gate spacer 140 may be positioned between the first source/drain 150 and the first gate insulating film 147. More specifically, because one sidewall of the first inner spacer 142, the second inner spacer 142-1, and the fifth inner spacer 142-2 may be in contact with the first gate insulating film 147, while the other sidewall of the first inner spacer 142, the second inner spacer 142-1, and the fifth inner spacer 142-2 may be in contact with the first source/drain 150, the first source/drain 150 and the first gate insulating film 147 may not be in contact with each other between the first nanowire 120 and the third nanowire 125 and the substrate 100.

The first interlayer insulating film 180 may be formed on the first source/drain 150, the first gate spacer 140, and the field insulating film 105.

The first interlayer insulating film 180 may include at least one of low-k material, oxide film, nitride film, and oxynitride film. For example, the low-k material may be flowable oxide (FOX), tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), high density plasma (HDP) oxide, plasma enhanced oxide (PEOX), flowable CVD (FCVD) oxide, or a combination thereof.

The device formed in the second region II may be similar to that in the first region I. Specifically, the second region II may include a second fin-type pattern 210, a second nanowire 220, a fourth nanowire 225, a second gate insulating film 247, a second function film 231, a second filling film 230, a second gate spacer 240, a second source/drain 250, and all the other structures which correspond to the structures shown in first region I.

For example, the second fin-type pattern 210, the second nanowire 220, the fourth nanowire 225, the second gate insulating film 247, the second function film 231, the second filling film 230, the second gate spacer 240, and the second source/drain 250 may have same or similar characteristics as the first fin-type pattern 110, the first nanowire 120, the third nanowire 125, the first function film 131, the first filling film 130, the first gate spacer 140, and the first source/drain 150 described above.

Further, the second interlayer insulating film 280, the second through holes 240h1 and 240h2, the second interfacial layer 246, the second high-k insulating film 245, the third inner spacer 242, the fourth inner spacer 242-1, the sixth inner spacer 242-2, and the second outer spacer 241 may also have same or similar characteristics as the first interlayer insulating film 180, the first interfacial layer 146, the first high-k insulating film 145, the first inner spacer 142, the second inner spacer 142-1, the fifth inner spacer 142-2, and the first outer spacer 141, respectively.

However, while the second function film 231 may include TiSiN like the first function film 131, the Si concentration may be lower. A thickness of the second function film 231 may be equal to a thickness of the first function film 131.

The semiconductor device shown in FIGS. 5 to 8 may correspond to that shown in FIG. 1. Specifically, the first region I and the second region II in FIGS. 5 to 8 may correspond to the first region I and the second region II in FIG. 1, respectively. The first nanowire 120 and the third nanowire 125 correspond to the first channel region 1110, and the second nanowire 220 and the fourth nanowire 225 correspond to the second channel region 1210.

Further, the first gate insulating film 147 and the second gate insulating film 247 in FIGS. 5 to 8 correspond to the first gate insulating film 1120 and the second gate insulating film 1220 in FIG. 1. Further, the first function film 131 and the second function film 231 in FIGS. 5 to 8 correspond to the first function film 1130 and the second function film 1230 in FIG. 1. Further, the first filling film 130 and the second filling film 230 in FIGS. 5 to 8 correspond to the first filling film 1140 and the second filling film 1240 in FIG. 1.

The gate stack structure of FIG. 1 may be implemented as the gate-all-around structure of FIGS. 5 to 8. In the drawings, the number of nanowires is shown as two, but this is provided only for illustrative purpose and exemplary embodiments are not limited thereto. In some embodiments of the present disclosure, the number of nanowires may be one, or more than two.

Hereinbelow, a semiconductor device according to some exemplary embodiments will be described with reference to FIGS. 2 and 9. In the following description, the description of previously disclosed exemplary embodiments that has already been provided above will not be described here or will be described as briefly as needed for the sake of brevity.

Figure 9:
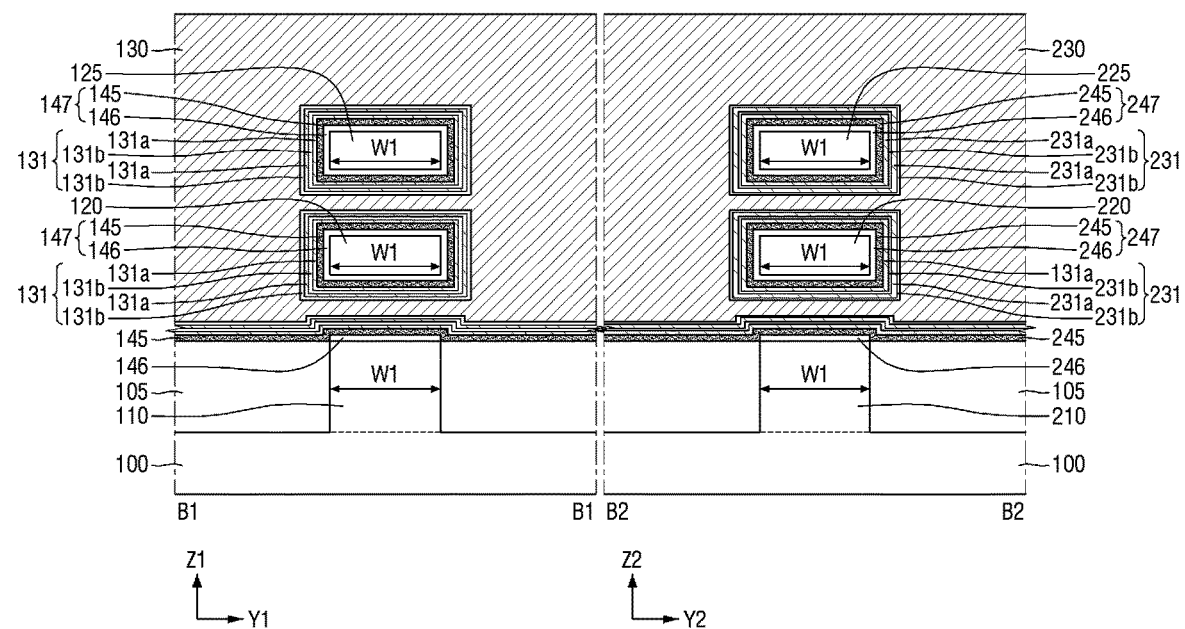
FIG. 9 is a cross sectional view provided to explain a semiconductor device according to some exemplary embodiments.

FIG. 9 is a cross sectional view provided to explain a semiconductor device according to some exemplary embodiments.

As shown in FIGS. 2 and 9, the first function film 1130 and the second function film 1230 of FIG. 2 may be formed in a gate-all-around structure, which is the semiconductor device shown in FIG. 9.

The first function film 131 may have a structure in which the first interfacial function film 131*a* and the first barrier function film 131*b* are alternately stacked. Although each of the first interfacial function film 131*a* and the first barrier function film 131*b* is shown as a pair in the drawings, in some embodiments, each of the first interfacial function film 131*a* and the first barrier function film 131*b* may be more than two, or may be one.

The second function film 231 may have a structure in which the second interfacial function film 231*a* and the second barrier function film 231*b* are alternately stacked. Although each of the second interfacial function film 231*a* and the second barrier function film 231*b* is shown as a pair in the drawings, in some embodiments, each of the second interfacial function film 231*a* and the second barrier function film 231*b* may be more than two, or may be one.

Hereinbelow, a semiconductor device according to some exemplary embodiments will be described with reference to FIGS. 1, 10 and 11. In the following description, the previous description of exemplary embodiments already provided above will not be described here or will be described as briefly as needed for the sake of brevity.

Figure 10:
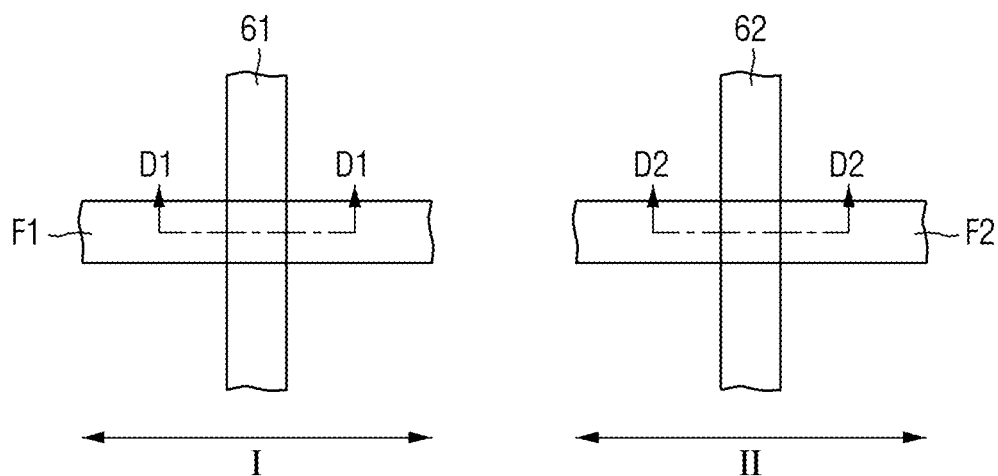
FIG. 10 is a layout diagram provided to explain a semiconductor device according to some exemplary embodiments.
Figure 11:
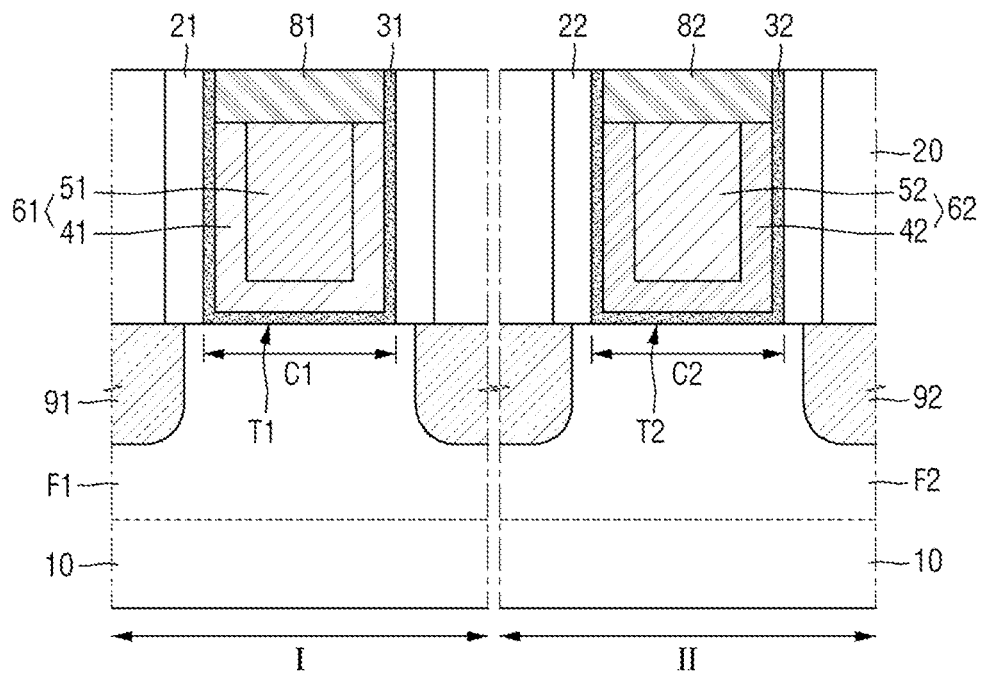
FIG. 11 is a cross sectional view taken on lines D1-D1 and D2-D2 of FIG. 10.

FIG. 10 is a layout view provided to explain a semiconductor device according to some exemplary embodiments, and FIG. 11 is a cross sectional view taken on lines D1-D1 and D2-D2 of FIG. 10.

As shown in FIGS. 1, 10 and 11, a semiconductor device according to some exemplary embodiments includes a substrate 10, an interlayer insulating film 20, spacers 21 and 22, high-k films 31 and 32, gate patterns 61 and 62, capping patterns 81 and 82, and source/drains 91 and 92.

The substrate 10 includes a first region I and a second region II, wherein the first region I includes a first fin F1 protruding from the substrate 10 and the second region II includes a second fin F2 protruding from the substrate 10. The first gate pattern 61 may extend on the first fin F1 in a direction intersecting the first fin F1, and the second gate pattern 62 may extend on the second fin F2 in a direction intersecting the second fin F2.

The interlayer insulating film 20 may be formed on the substrate 10. The interlayer insulating film 20 may include a first trench Ti in the first region I, and a second trench T2 in the second region II. The interlayer insulating film 20 may be formed by stacking two or more insulating films. As illustrated, the first spacer 21 and the second spacer 22 may be formed on sidewalls of the first trench T1 and the second trench T2, respectively, and the substrate 10 may be disposed on bottom surfaces of the first trench T1 and the second trench T2. However, exemplary embodiments are not limited to the example given above.

The interlayer insulating film 20 may include at least one of silicon oxide, silicon nitride, silicon oxynitride, and a low-k dielectric material with a smaller dielectric constant than silicon oxide.

The first spacer 21 may form a sidewall of the first trench Ti and may include at least one of silicon nitride (SiN), silicon oxynitride (SiON), silicon oxide (SiO2), silicon oxycarbonitride (SiOCN), or a combination thereof.

The second spacer 22 may form a sidewall of the second trench T2 and may include at least one of silicon nitride (SiN), silicon oxynitride (SiON), silicon oxide (SiO2), silicon oxycarbonitride (SiOCN), or a combination thereof.

The first high-k film 31 may be conformally formed along the sidewall and the bottom surface of the first trench T1. The first high-k film 31 may entirely cover the sidewall of the first trench T1. Thus, the height of the uppermost portion of the upper surface of the first high-k film 31 may be same as that of the upper surface of the first spacer 21. However, exemplary embodiments are not limited to the example given above.

The second high-k film 32 may be conformally formed along the sidewall and the bottom surface of the second trench T2. The second high-k film 32 may entirely cover the sidewall of the second trench T2. Thus, the height of the uppermost portion of the upper surface of the second high-k film 32 may be same as that of the upper surface of the second spacer 22. However, exemplary embodiments are not limited to the example given above.

The first high-k film 31 and the second high-k film 32 may include a high-k material having a higher dielectric constant than a silicon oxide film. For example, the high-k films 31 and 32 may include materials selected from the group consisting of HfSiON, HfO$_2$, ZrO$_2$, Ta$_2$O$_5$, TiO$_2$, SrTiO$_3$ or (Ba,Sr)TiO$_3$, and so on. Such high-k films 31 and 32 may be formed to a proper thickness depending on a type of the device intended to be formed.

Although not illustrated in FIG. 11, in some exemplary embodiments, an interface film may be included between the high-k films 31 and 32 and the substrate 10. The interface film may be formed along the bottom surfaces of the trenches T1 and T2. The interface film 30 may play a role of preventing a defective interface between the substrate 10 and the high-k films 31 and 32. The interface film may include a low dielectric material layer having a dielectric constant (k) of 9 or lower, such as a silicon oxide film (k is approximately 4) or a silicon oxynitride film (k is approximately 4 to 8 depending on content of oxygen atoms and nitrogen atoms). Alternatively, the interface film may be formed of silicate, or a combination of films exemplified above.

The first gate pattern 61 may include a first function film 41 and a first filling film 51. The first function film 41 may be conformally formed along the bottom surface and the side surface of the first trench T1, and the first filling film 51 may fill the portion not filled with the first function film 41.

The second gate pattern 62 may include a second function film 42 and a second filling film 52. The second function film 42 may be conformally formed along the bottom surface and the side surface of the second trench T2, and the second filling film 52 may fill the portion not filled with the second function film 42.

The function films 41 and 42 may include TiSiN. In this case, the Si concentration in the first function film 41 may be lower than the Si concentration Si in the second function film 42. As a result, the threshold voltage of the transistor in the first region I may be lower than that of the transistor in the second region II.

The first source/drain 91 may be formed on the side surface of the first gate pattern 61. The second source/drain 92 may be formed on the side surface of the second gate pattern 62. A portion between the first source/drain 91 of the first fin F1 may be defined as a first channel region C1. Further, a portion between the second source/drain 92 of the second fin F2 may be defined as a second channel region C2.

The semiconductor device shown in FIGS. 10 and 11 may correspond to that shown in FIG. 1. The first channel region C1 and the second channel region C2 of FIGS. 10 and 11 may correspond to the first channel region 1110 and the second channel region 1210 of FIG. 1. Further, the high-k films 31 and 32 and the interface film in FIGS. 10 and 11 may correspond, respectively, to the first gate insulating film 1120 and the second gate insulating film 1220 in FIG. 1. Further, the function films 41 and 42 in FIGS. 10 and 11 may correspond, respectively, to the first function film 1130 and the second function film 1230 in FIG. 1. Finally, the filling films 51 and 52 in FIGS. 10 and 11 may correspond, respectively, to the first filling film 1140 and the second filling film 1240 in FIG. 1.

Thus, the gate stack structure of FIG. 1 may be implemented as the fin-type structure of FIGS. 10 and 11.

Hereinbelow, a semiconductor device according to some exemplary embodiments will be described with reference to FIGS. 2 and 12. In the following description, the description previously given for the exemplary embodiments already provided above will not be described here or will be described as briefly as necessary for the sake of brevity.

Figure 12:
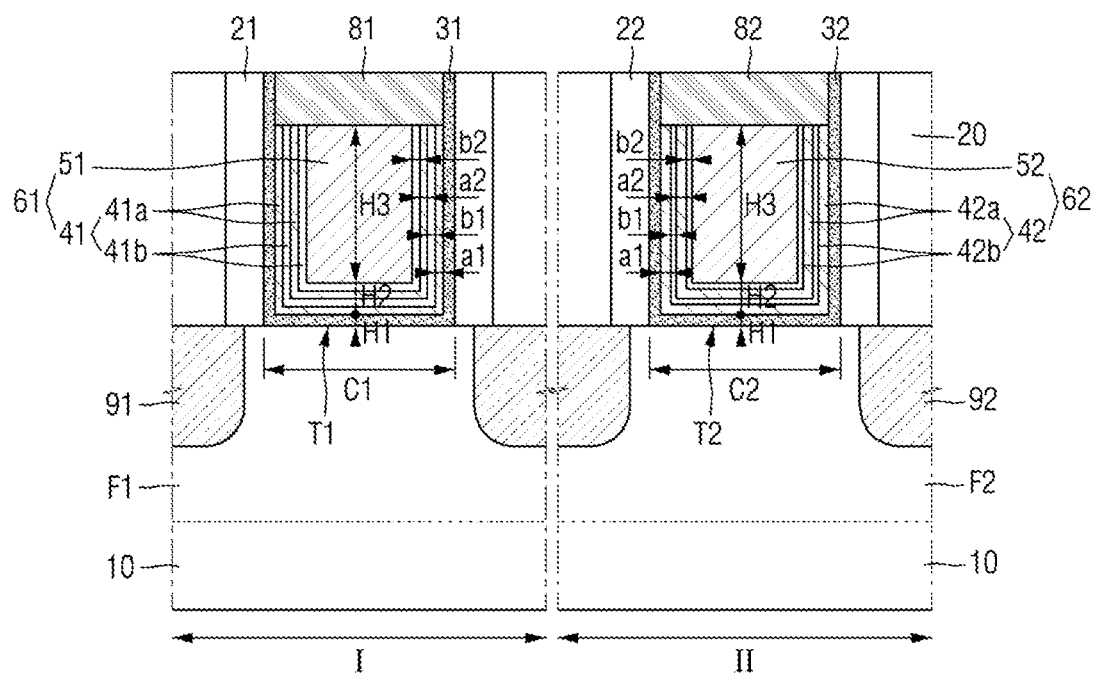
FIG. 12 is a cross sectional view provided to explain a semiconductor device according to some exemplary embodiments.

FIG. 12 is a cross sectional view provided to explain a semiconductor device according to some exemplary embodiments.

As shown in FIGS. 2 and 12, the first function film 1130 and the second function film 1230 of FIG. 2 may be formed in the fin-type structure, which is the semiconductor device in FIG. 12.

The first function film 41 may have a structure in which the first interfacial function film 41a and the first barrier function film 41b are alternately stacked. Although each of the first interfacial function films 41a and the first barrier function films 41b are shown as a pair in the drawings, in some embodiments, each of the first interfacial function films 41a and the first barrier function films 41b may be more than two, or may be one.

The second function film 42 may have a structure in which the second interfacial function films 42a and the second barrier function films 42b are alternately stacked. Although each of the second interfacial function films 42a and the second barrier function films 42b are shown as a pair in the drawings, in some embodiments, each of the second interfacial function films 42a and the second barrier function films 42b may be more than two, or may be one.

Hereinbelow, a semiconductor device according to some exemplary embodiments will be described with reference to FIGS. 1, 13 and 14. In the following description, the previous description of exemplary embodiments already provided above will not be described here or will be described as briefly as necessary for the sake of brevity.

Figure 13:
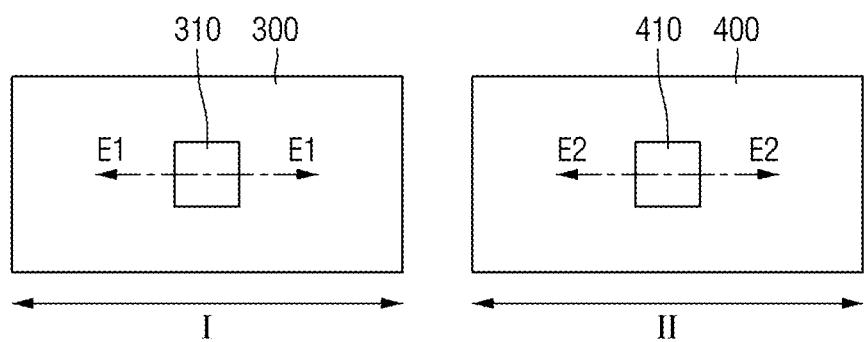
FIG. 13 is a layout diagram provided to explain a semiconductor device according to some exemplary embodiments.
Figure 14:
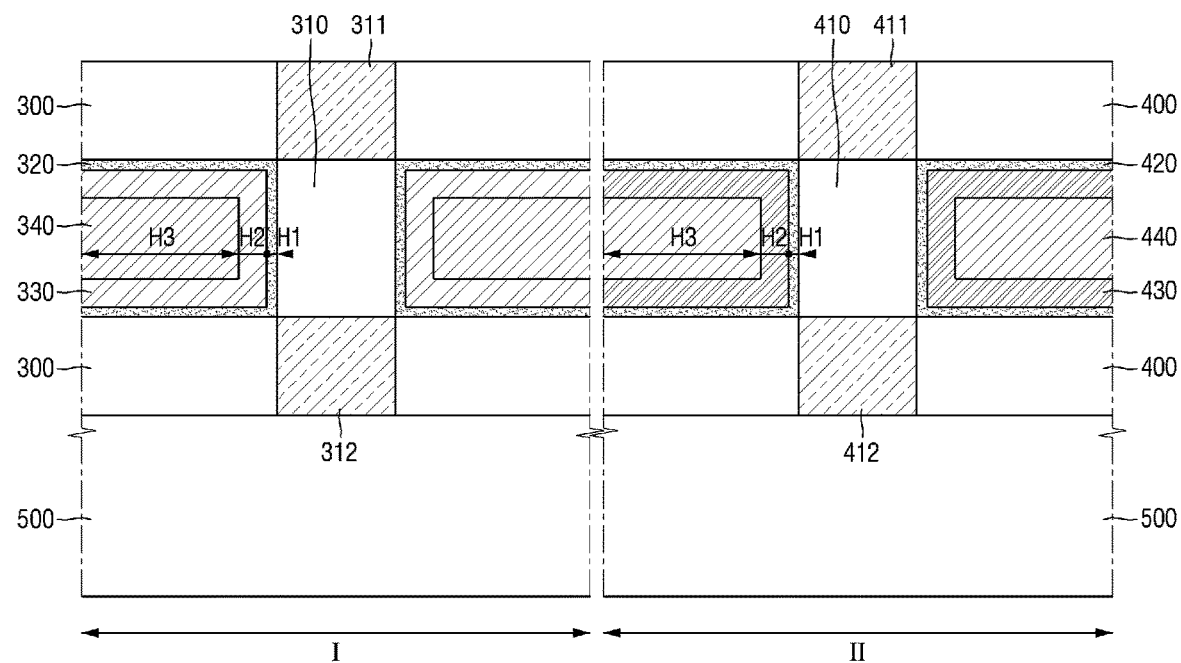
FIG. 14 is a cross sectional view taken on lines E1-E1 and E2-E2 of FIG. 13.

FIG. 13 is a layout view provided to explain a semiconductor device according to some exemplary embodiments, and FIG. 14 is a cross sectional view taken on lines E1-E1 and E2-E2 of FIG. 13.

As shown in FIGS. 1, 13 and 14, a semiconductor device according to some embodiments of the present disclosure includes a substrate 500, vertical channel regions 310 and 410, upper sources/drains 312 and 412, lower source/drains 311 and 411, interlayer insulating films 300 and 400, gate insulating films 320 and 420, function films 330 and 430, and filling films 340 and 440.

The substrate 500 includes a first region I and second regions II.

The interlayer insulating films 300 and 400 may be formed on the substrate 500. The interlayer insulating films 300 and 400 may include a first interlayer insulating film 300 formed in the first region I and a second interlayer insulating film 400 formed in the second region II.

The vertical channel regions 310 and 410 may be formed through the interlayer insulating films 300 and 400. The upper source/drain regions 312 and 412 are formed on the upper portions of the vertical channel regions 310 and 410, and the lower source/drain regions 311 and 411 are formed on the lower portions of the vertical channel regions 310 and 410.

The gate insulating films 320 and 420, the function films 330 and 430, and the filling films 340 and 440 may be formed on the lateral sides of the vertical channel regions 310 and 410 in a horizontal direction. The gate insulating films 320 and 420 may horizontally surround the vertical channel regions 310 and 410, and may be conformally formed along the upper and lower surfaces of the interlayer insulating films 300 and 400. The function films 330 and 430 are conformally formed on the gate insulating films 320 and 420, and the filling films 340 and 440 may fill the portions left unfilled by the function films 330 and 430.

In each region, the thicknesses of the gate insulating films 320 and 420, the function films 330 and 430, and the filling films 340 and 440 may be equally the first thickness H1, the second thickness H2, and the third thickness H3, respectively.

The function films 330 and 430 may include a first function film 330 in the first region I and a second function film 430 in the second region II. The first function film 330 and the second function film 340 may include TiSiN. The Si concentration in the first function film 330 may be less than the Si concentration in the second function film 340.

Accordingly, the threshold voltage in the vertical columnar FET (V-FET) structure may be lower in the first region I than in the second region II.

The semiconductor device shown in FIGS. 13 and 14 may correspond to that shown in FIG. 1. Specifically, the first region I and the second region II in FIGS. 13 and 14 may correspond to the first region I and the second region II in FIG. 1, respectively. In addition, the vertical channel regions 310 and 410 in FIGS. 13 and 14 may correspond to the first channel region 1110 and the second channel region 1210, respectively.

Further, the gate insulating films 320 and 420 in FIGS. 13 and 14 may correspond, respectively, to the first gate insulating film 1120 and the second gate insulating film 1220 in FIG. 1. Further, the function films 330 and 430 in FIGS. 13 and 14 may correspond, respectively, to the first function film 1130 and the second function film 1230 in FIG. 1.

Further, the filling films 340 and 440 in FIGS. 13 and 14 may correspond, respectively, to the first filling film 1140 and the second filling film 1240 in FIG. 1.

The gate stack structure of FIG. 1 may be implemented as the V-FET structure of FIGS. 13 and 14. In the drawings, the number of the vertical channel regions is shown as one, but this is provided only for illustrative purpose and exemplary embodiments are not limited thereto. In some embodiments of the present disclosure, there may be two or more vertical channel regions that are vertically spaced from one another and stacked.

Hereinbelow, a semiconductor device according to some exemplary embodiments will be described with reference to FIGS. 2 and 15 In the following description, previous description of exemplary embodiments already provided above will not be described here or will be described as briefly as necessary for the sake of brevity.

Figure 15:
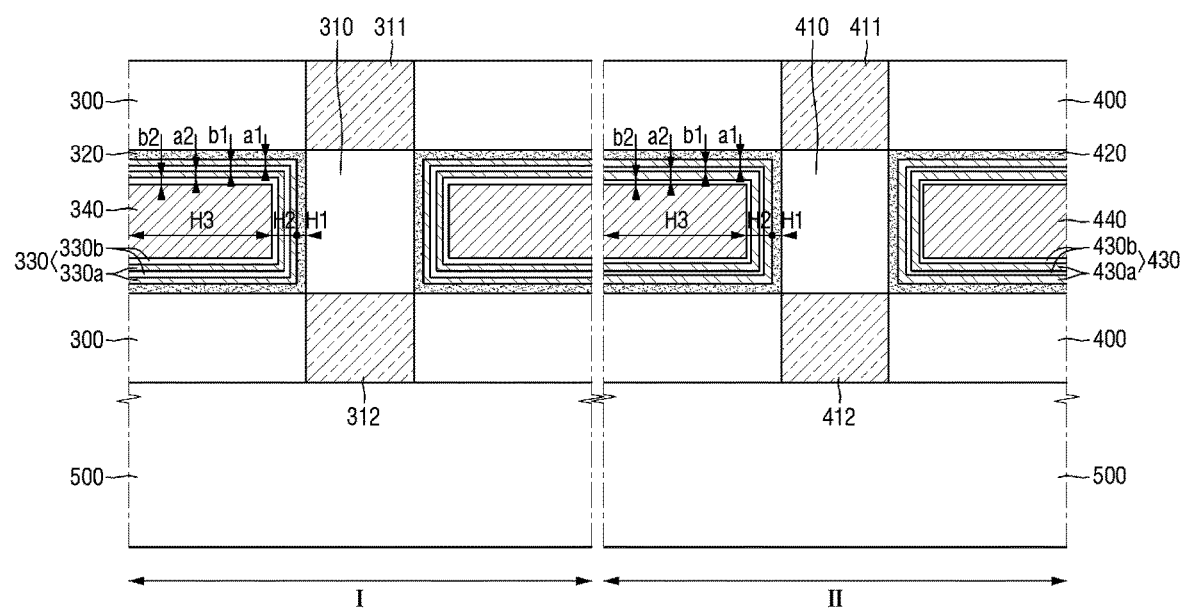
FIG. 15 is a cross sectional view provided to explain a semiconductor device according to some exemplary embodiments.

FIG. 15 are cross sectional views provided to explain a semiconductor device according to some exemplary embodiments.

As shown in FIGS. 2 and 15, the first function film 1130 and the second function film 1230 in FIG. 2 may be formed in the V-FET structure, which is the semiconductor device in FIG. 15.

The first function film 330 may have a structure in which the first interfacial function film 330a and the first barrier function films 330b are alternately stacked. Although the first interfacial function films 330a and the first barrier function films 330b are each shown as a pair in the drawings, in some embodiments, the first interfacial function films 330a and the first barrier function films 330b may each be more than two, or may be one.

The second function film 430 may have a structure in which the second interfacial function film 430a and the second barrier function film 430b are alternately stacked. Although the second interfacial function film 430a and the second barrier function film 430b are each shown as a pair in the drawings, in some embodiments, the second interfacial function film 430a and the second barrier function film 430b may each be more than two, or may be one.

Hereinbelow, a method of fabricating a semiconductor device according to some exemplary embodiments will be explained with reference to FIGS. 1 and 16 to 18. In the following description, previous description of the exemplary embodiments already provided above will not be described here or will be described as briefly as necessary for the sake of brevity.

Figure 16:
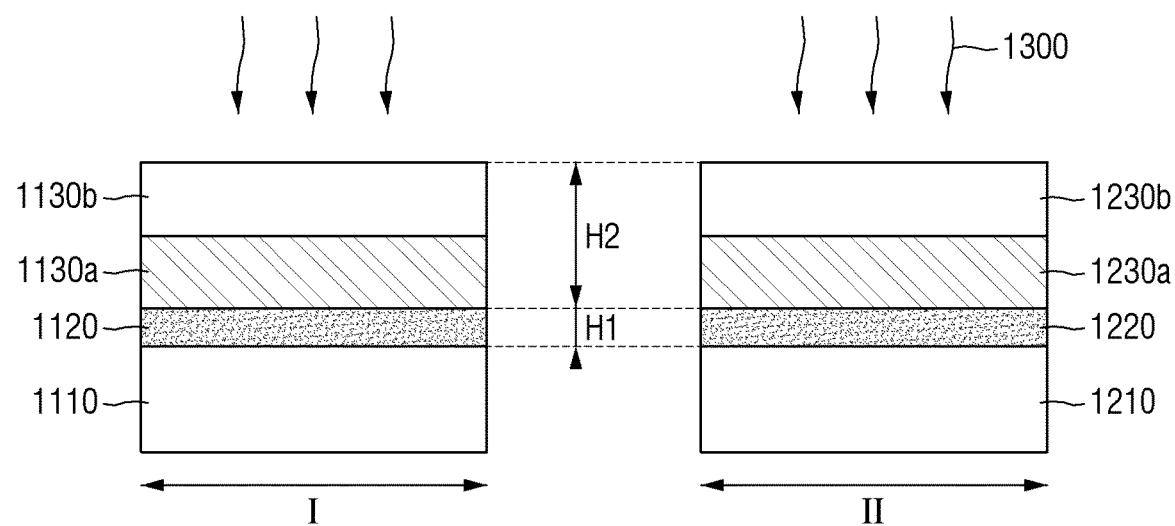
FIGS. 16 to 18 are views illustrating intermediate stages of fabrication, provided to explain a method for fabricating a semiconductor device according to some exemplary embodiments.
Figure 17:
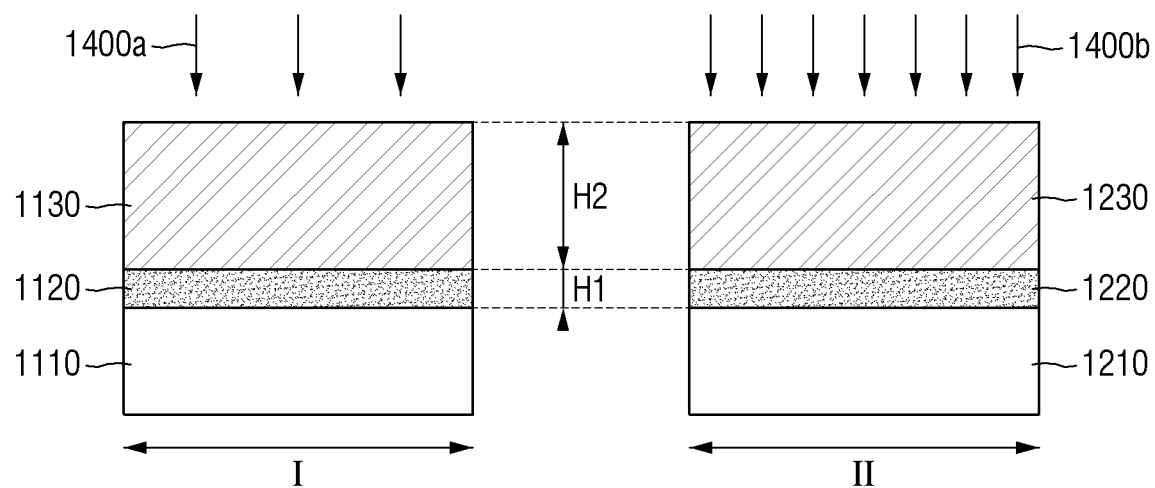
Figure 18:
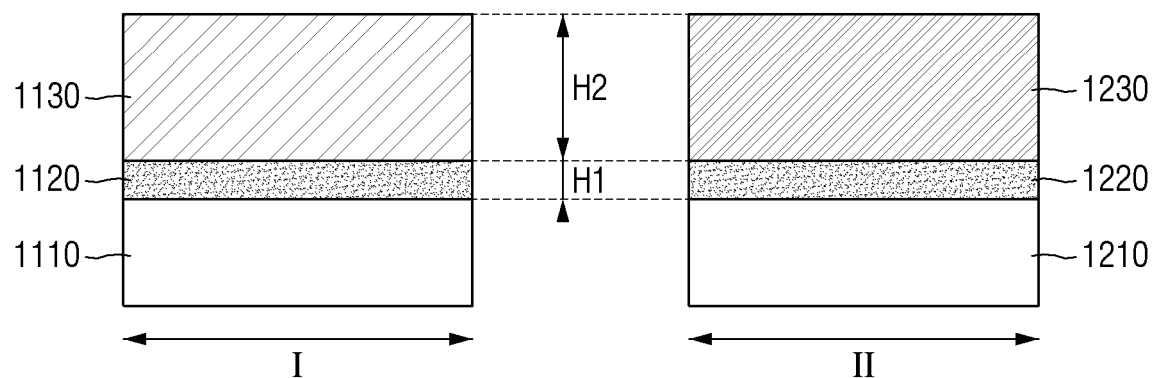

FIGS. 16 to 18 are views illustrating intermediate stages of fabrication, provided to explain the method for fabricating the semiconductor device according to some exemplary embodiments.

As shown in FIG. 16, a first gate insulating film 1120 is formed on a first channel region 1110 in a first region I, and a first Ti film 1130a and a first N film 1130b are sequentially formed on a first gate insulating film 1120. At this time, the order of the first Ti film 1130a and the first N film 1130b may be reversed.

Likewise, in the second region II, a second gate insulating film 1220 is formed on a second channel region 1210, and a second Ti film 1230a and a second N film 1230b are sequentially formed on a second gate insulating film 1220. At this time, the order of the second Ti film 1230a and the second N film 1230b may be reversed.

At this time, the first gate insulating film 1120 and the second gate insulating film 1220 may be formed with the first thickness H1. Each of the first Ti film 1130a plus the first N film 1130b, and the second Ti film 1230a plus the second N film 1230b, may be formed with the second thickness H2.

Next, a first heat treatment 1300 is performed in the first region I and the second region II.

Then, as shown in FIG. 17, the first heat treatment 1300 may cause the first Ti film 1130a and the first N film 1130b to become the first function film 1130, and the second Ti film 1230a and the second N film 1230b to become the second function film 1230.

Then, the first doping 1400a may be performed in the first region I, and the second doping 1400b may be performed in the second region II.

Both the first doping 1400a and the second doping 1400b may be Si doping. At this time, the amount of Si doping of the second doping 1400b may be greater than that of the first doping 1400a. This may be performed by varying the doping density, or by varying the doping time.

Then, as shown in FIG. 18, the Si concentration of the first function film 1130 and that of the second function film 1230 are different from each other.

Next, as shown in FIG. 1, a first filling film 1140 and a second filling film 1240 are formed on the first function film 1130 and the second function film 1230, respectively.

A method for fabricating a semiconductor device according to some embodiments of the present disclosure may implement a transistor having a multi-threshold voltage through the concentration of a function film without forming a barrier film and a work function adjusting film.

In particular, the process of forming the function films of the same thickness in different regions can be much simpler and lower in cost than the method of controlling the thickness of the work function adjusting film differently. As a result, the semiconductor manufacturing cost and efficiency can be significantly lowered.

Hereinbelow, a method for fabricating a semiconductor device according to some exemplary embodiments will be explained with reference to FIGS. 2 and 19 to 22. In the following description, previous description of exemplary embodiments already provided above will not be described here or will be described as briefly as necessary for the sake of brevity.

FIGS. 19 to 22 are views illustrating intermediate stages of fabrication, provided to explain a method for fabricating a semiconductor device according to some exemplary embodiments.

Figure 19:
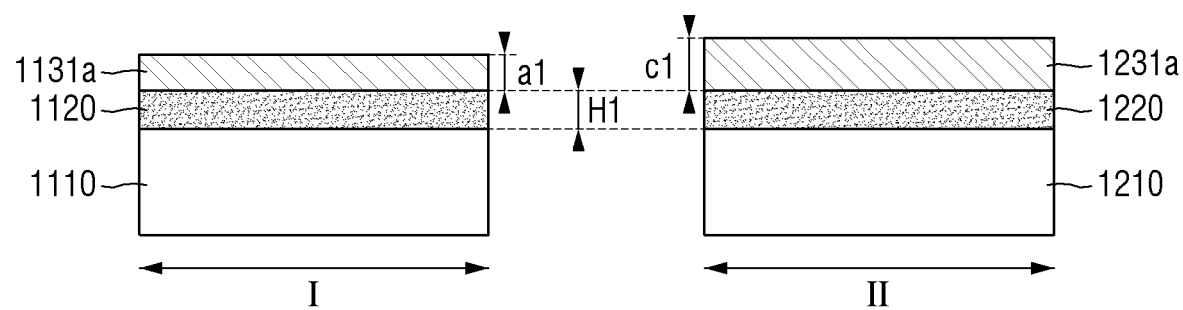
FIGS. 19 to 22 are views illustrating intermediate stages of fabrication, provided to explain a method for fabricating a semiconductor device according to some exemplary embodiments.

As shown in FIG. 19, a first gate insulating film 1120 is formed on a first channel region 1110 in a first region I, and a first interfacial function film 1131a is formed on the first gate insulating film 1120 with a thickness a1.

A second gate insulating film 1220 is formed on a second channel region 1210 in a second region II, and a second interfacial function film 1231a is formed on the second gate insulating film 1220 with a thickness c1.

The thickness a1 and the thickness c1 may be different from each other. The thickness c1 may be greater than the thickness a1. However, as will be described below, as long as the thickness a1+a2 is lower than the thickness c1+c2, whether the thickness c1 is greater or less than the thickness a1 is not limiting on the exemplary embodiments.

The first interfacial function film 1131a and the second interfacial function film 1231a may be formed by an atomic layer deposition (ALD) method.

Figure 20:
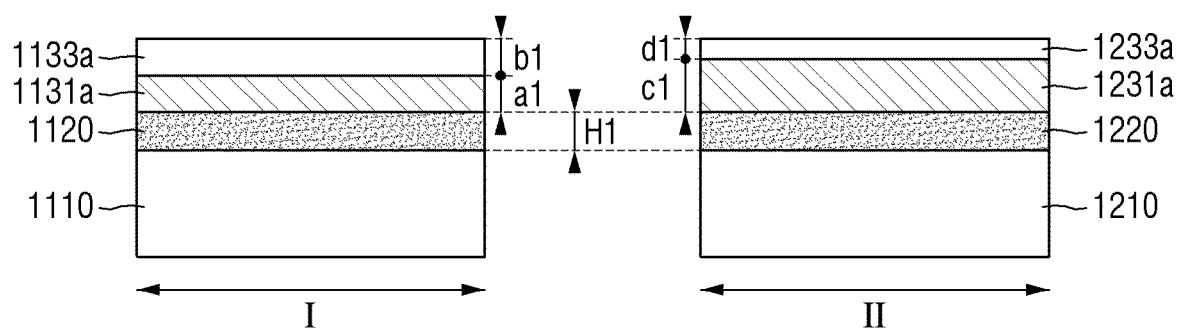

Next, as shown in FIG. 20, in the first region I, the first barrier function film a is formed on the first interfacial function film 1131a with a thickness b1.

In the second region II, the second barrier function film 1233a is formed on the second interfacial function film 1231a with a thickness d1.

The thickness b1 and the thickness d1 may be different from each other. The thickness b1 may be greater than the thickness d1. However, as will be described below, as long as the thickness b1+b2 is lower than the thickness d1+d2, whether the thickness b1 is greater or less than the thickness d1 is not limiting on the exemplary embodiments.

The first barrier function film 1133a and the second barrier function film 1233a may be formed in a soak method.

Figure 21:
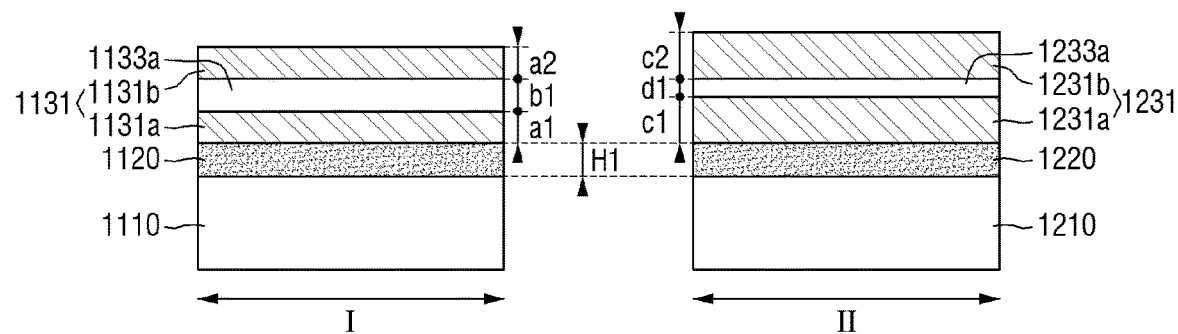

Next, as shown in FIG. 21, in the first region I, the first interfacial function film 1131b is formed on the first barrier function film 1131b with a thickness a2.

In the second region II, the second interfacial function film 1231b is formed on the second barrier function film 1233a with a thickness c2.

At this time, the thickness a1+a2 may be less than the thickness c1+c2.

The first interfacial function film 1131b and the second interfacial function film 1231b may be formed by an atomic layer deposition (ALD) method.

Figure 22:
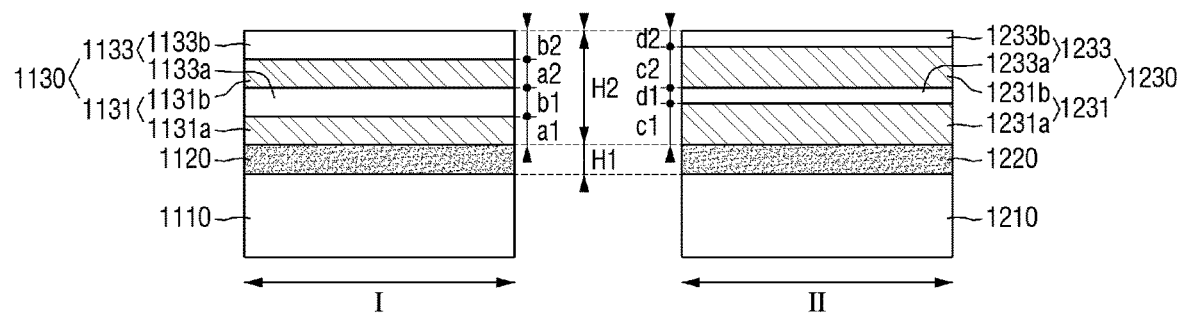

Next, as shown in FIG. 22, in the first region I, the first barrier function film 1133b is formed on the first interfacial function film 1131b with a thickness b2.

In the second region II, the second barrier function film 1233b is formed on the second interfacial function film 1231b with a thickness d2.

At this time, the thickness b1+b2 may be greater than the thickness d1+d2.

However, the thickness a1+a2+b1+b2 may be the second thickness H2 which is the same as the thickness c1+c2+d1+d2.

The first barrier function film 1133b and the second barrier function film 1233b may be formed in a soak method.

The stacked structure of the first interfacial function films 1131a and 1131b and the first barrier function films 1133a and 1133b may be completed with the first function film 1130, and the second interfacial function films 1231a and 1231b and the second barrier function films 1233a and 1233b may be completed with the second function film 1230.

At this time, the processes of forming the first function film 1130 and the second function film 1230 may all be performed in-situ. However, exemplary embodiments are not limited to the example given above. Thus, the semiconductor device manufacturing method according to some embodiments of the present disclosure can provide a semiconductor device with few defects and high efficiency.

Next, As shown in FIG. 2, the first filling film 1140 may be formed on the first function film 1130, and the second filling film 1240 may be formed on the second function film 1230.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
   a substrate;
   a first fin-type pattern disposed on the substrate;
   a second fin-type pattern disposed on the substrate;
   a first source/drain disposed on the first fin-type pattern;
   a second source/drain disposed on the second fin-type pattern;
   a first nanowire disposed on the first fin-type pattern and spaced apart from the first fin-type pattern, the first nanowire being connected with the first source/drain;
   a second nanowire disposed on the first nanowire and spaced apart from the first fin-type pattern, the second nanowire being connected with the first source/drain, the second nanowire being spaced apart from the first nanowire;
   a third nanowire disposed on the second fin-type pattern and spaced apart from the second fin-type pattern, the third nanowire being connected with the second source/drain;
   a fourth nanowire disposed on the third nanowire and spaced apart from the second fin-type pattern, the fourth nanowire being connected with the second source/drain, the fourth nanowire being spaced apart from the third nanowire;
   a first gate-all-around structure disposed on the first fin-type pattern, and encircling the first nanowire and the second nanowire; and
   a second gate-all-around structure disposed on the second fin-type pattern, and encircling the third nanowire and the fourth nanowire,
   wherein the first gate-all-around structure includes a first conductive film and a first gate insulating layer surrounding the first nanowire, and a second conductive film and a second gate insulating layer surrounding the second nanowire,
   wherein the second gate-all-around structure includes a third conductive film and a third gate insulating layer surrounding the third nanowire, and a fourth conductive film and a fourth state insulating layer surrounding the fourth nanowire,
   wherein each of the first and second gate insulating layers includes a first high-k insulating film and a first interfacial layer disposed on a periphery of the first nanowire and a periphery of the second nanowire, and
   wherein each of the third and fourth gate insulating layers includes a second high-k insulating film and a second interfacial layer disposed on a periphery of the third nanowire and a periphery of the fourth nanowire,
   wherein the first conductive film includes a first filling film and a first function film, and the second conductive film includes a second film and a second function film,
   wherein the third conductive film includes a third film and a third function film, and the fourth conductive film includes a fourth filling film and a fourth function film,
   wherein the first gate-all-around structure includes the first function film and the second function film each having a first Si concentration, and
   wherein the second gate-all-around structure includes the third function film and the fourth function film each having a second Si concentration different from the first Si concentration.

2. The semiconductor device of claim 1, further comprising:
   a first gate spacer disposed on sidewalls of the first gate-all-around structure; and
   a second gate spacer disposed on sidewalls of the second gate-all-around structure.

3. The semiconductor device of claim 2, wherein a thickness of the first gate spacer is different from a thickness of the first interfacial layer.

4. The semiconductor device of claim 1, wherein a thickness of each of the first and second function films is the same as a thickness of each of the third and fourth function films.

5. The semiconductor device of claim 1, wherein the first and second nanowires are used as a first channel, and
wherein the third and fourth nanowires are used as a second channel.

6. The semiconductor device of claim 1, wherein each of the first nanowire, the second nanowire, the third nanowire and the fourth nanowire includes silicon.

7. The semiconductor device of claim 1, wherein the first gate-all-around structure includes the first function film and the second function film each having a first thickness of Si, and
wherein the second gate-all-around structure includes the third function film and the fourth function film each having a second thickness of Si the same as the first thickness of Si.

8. A semiconductor device comprising:
a substrate including a first region and a second region;
a first source/drain disposed on the first region of the substrate;
a second source/drain disposed on the second region of the substrate;
a first nanowire disposed on the first region of the substrate and spaced apart from the substrate, the first nanowire being connected with the first source/drain;
a second nanowire disposed on the first region of the substrate and spaced apart from the substrate, the second nanowire being connected with the first source/drain, the second nanowire being spaced apart from the first nanowire;
a third nanowire disposed on the second region of the substrate and spaced apart from the substrate, the third nanowire being connected with the second source/drain;
a fourth nanowire disposed on the second region of the substrate and spaced apart from the substrate, the fourth nanowire being connected with the second source/drain, the fourth nanowire being spaced apart from the third nanowire;
a first gate-all-around structure disposed on the first region of the substrate, and encircling the first nanowire and the second nanowire; and
a second gate-all-around structure disposed on the second region of the substrate, and encircling the third nanowire and the fourth nanowire,
wherein the first and second nanowires are used as a first channel for a first transistor,
wherein the third and fourth nanowires are used as a second channel for a second transistor,
wherein the first gate-all-around structure includes a first conductive film and a first gate insulating layer surrounding the first nanowire, and a second conductive film and a second state insulating layer surrounding the second nanowire,
wherein the second gate-all-around structure includes a second conductive film and a second gate insulating layer surrounding the third nanowire, and a third conductive film and a fourth gate insulating layer surrounding the fourth nanowire,
wherein the first conductive film includes a first filling film and a first function film, and the second conductive film includes a second filling film and a second function film,
wherein the third conductive film includes a third filling film and a third function film, and the fourth conductive film includes a fourth filling, film and a fourth function film,
wherein the first gate-ail-around structure includes the first function film and the second function film each having a first thickness of Si, and
wherein the second gate-all-around structure includes the third function film and the fourth function film each having a second thickness of Si different from the first thickness of Si.

9. The semiconductor device of claim 8, further comprising:
a first gate spacer disposed on sidewalls of the first gate-all-around structure; and
a second gate spacer disposed on sidewalls of the second gate-all-around structure.

10. The semiconductor device of claim 9, wherein each of the first and second gate insulating layers includes a first high-k insulating film and a first interfacial layer disposed on a periphery of the first nanowire and a periphery of the second nanowire, and
wherein each of the third and fourth gate insulating layers includes a second high-k insulating film and a second interfacial layer disposed on a periphery of the third nanowire and a periphery of the fourth nanowire.

11. The semiconductor device of claim 10, wherein a thickness of the first gate spacer is different from a thickness of the first interfacial layer.

12. The semiconductor device of claim 8, wherein each of the first, second, third and fourth function films includes TiN.

13. The semiconductor device of claim 8, wherein each of the first nanowire, the second nanowire, the third nanowire and the fourth nanowire includes silicon.

14. The semiconductor device of claim 8, wherein the first gate-all-around structure includes the first function film and the second function film each having a first Si concentration, and
wherein the second gate-all-around structure includes the third function film and the fourth function film each having a second Si concentration the same as the first Si concentration.

15. A semiconductor device comprising:
a substrate;
a gate-all-around structure disposed on the substrate;
a source/drain disposed on the substrate, and disposed on both sides of the gate-all-around structure;
a first nanowire disposed on the substrate and spaced apart from the substrate; and
a second nanowire disposed on the substrate and spaced apart from the substrate, the second nanowire being spaced apart from the first nanowire,
wherein a first end portion of the first nanowire is connected to a first portion of the source/drain,
wherein a second end portion of the first nanowire is connected to a second portion of the source/drain,
wherein a first end portion of the second nanowire is connected to the first portion of the source/drain,
wherein a second end portion of the second nanowire is connected to the second portion of the source/drain,
wherein the gate-all-around structure includes a first conductive film and a first gate insulating layer surrounding the first nanowire, and a second conductive film and a second gate insulating layer surrounding the second nanowire, wherein each of the first and second gate insulating layer includes a high-k insulating film and an interfacial layer disposed on a periphery of the first nanowire and a periphery of the second nanowire, wherein the first conductive film includes a first filling film and a first function film, and the second conductive film includes a second filling film and a second function film, wherein the first function film of the first conductive film and the second function film of the second conductive film are spaced apart from each other in a vertical direction with respect to the substrate, and wherein each of the first and second function films of the gate-all-around structure has the same Si concentration as each other.

16. The semiconductor device of claim 15, further comprising a gate spacer disposed on sidewalls of the gate-all-around structure.

17. The semiconductor device of claim 16, wherein a thickness of the gate spacer is different from a thickness of the interfacial layer.

18. The semiconductor device of claim 15, wherein the first and second nanowires are used as a channel for a transistor.

19. The semiconductor device of claim 15, wherein each of the first nanowire and the second nanowire includes silicon.

20. The semiconductor device of claim 15, wherein each of the first and second function films includes TiN.

* * * * *